US012796348B2

(12) United States Patent
Ravi et al.

(10) Patent No.: US 12,796,348 B2
(45) Date of Patent: Nov. 10, 2026

(54) SILICON CARBIDE EPITAXY

(71) Applicant: ThinSiC Inc., Santa Clara, CA (US)

(72) Inventors: Tirunelveli Subramaniam Ravi, San Jose, CA (US); Jinho Seo, Saratoga, CA (US)

(73) Assignee: ThinSiC Inc., Santa Clara, CA (US)

( * ) Notice: Subject to any disclaimer, the term of this patent is extended or adjusted under 35 U.S.C. 154(b) by 432 days.

(21) Appl. No.: 18/240,248

(22) Filed: Aug. 30, 2023

(65) Prior Publication Data

US 2025/0079165 A1 Mar. 6, 2025

(51) Int. Cl.

| | |
|---|---|
| ***C30B 25/04*** | (2006.01) |
| ***C30B 25/20*** | (2006.01) |
| ***C30B 29/36*** | (2006.01) |
| ***C30B 29/66*** | (2006.01) |
| ***C30B 33/08*** | (2006.01) |
| ***H10D 8/01*** | (2025.01) |
| ***H10D 8/60*** | (2025.01) |
| ***H10D 62/832*** | (2025.01) |
| ***H10P 14/20*** | (2026.01) |
| ***H10P 50/24*** | (2026.01) |
| ***H10P 52/00*** | (2026.01) |
| ***H10P 58/00*** | (2026.01) |
| ***H10P 95/00*** | (2026.01) |

(52) U.S. Cl.

CPC .......... *H10P 14/3408* (2026.01); *C30B 25/04* (2013.01); *C30B 25/20* (2013.01); *C30B 29/36* (2013.01); *C30B 29/66* (2013.01); *C30B 33/08* (2013.01); *H10D 8/051* (2025.01); *H10D 8/60* (2025.01); *H10D 62/8325* (2025.01); *H10P 14/20* (2026.01); *H10P 14/272* (2026.01); *H10P 14/276* (2026.01); *H10P 14/2904* (2026.01); *H10P 14/3456* (2026.01); *H10P 14/3466* (2026.01); *H10P 50/242* (2026.01); *H10P 52/00* (2026.01); *H10P 58/00* (2026.01); *H10P 95/112* (2026.01)

(58) Field of Classification Search

CPC ...... H10P 14/3408; C30B 25/04; C30B 25/20
USPC .......................................................... 428/698
See application file for complete search history.

(56) References Cited

U.S. PATENT DOCUMENTS

| | | | |
|---|---|---|---|
| 7,230,274 | B2 | 6/2007 | O'Loughlin et al. |
| 8,470,091 | B2 | 6/2013 | Kitou et al. |
| 10,125,435 | B2 | 11/2018 | Gunjishima et al. |
| 10,208,400 | B2 | 2/2019 | Miyazaki |
| 10,229,830 | B2 | 3/2019 | Hamano et al. |
| 10,329,689 | B2 | 6/2019 | Masumoto |
| 10,337,119 | B2 | 7/2019 | Hori |
| 10,370,775 | B2 | 8/2019 | Ohno et al. |

(Continued)

*Primary Examiner* — Katherine A Christy

(57) ABSTRACT

A semiconductor substrate comprising a first epitaxial silicon carbide layer and a second silicon carbide epitaxial layer. At least one semiconductor device is formed in or on the second silicon carbide epitaxial layer. The semiconductor substrate is formed overlying a silicon carbide substrate having a surface comprising silicon carbide and carbon. An exfoliation process is used to remove the semiconductor substrate from the silicon carbide substrate. The carbon on the surface of the silicon carbide substrate supports separation. A portion of the silicon carbide substrate on the semiconductor substrate is removed after the exfoliation process. The surface of the silicon carbide substrate is prepared for reuse in subsequent formation of semiconductor substrates.

27 Claims, 39 Drawing Sheets

(56) References Cited

U.S. PATENT DOCUMENTS

| | | | | |
|---|---|---|---|---|
| 10,396,163 | B2 | 8/2019 | Wada et al. | |
| 10,435,813 | B2 | 10/2019 | Ito et al. | |
| 10,450,672 | B2 | 10/2019 | Aigo et al. | |
| 10,526,699 | B2 | 1/2020 | Kanbara et al. | |
| 10,626,520 | B2 | 4/2020 | Aigo et al. | |
| 10,711,372 | B2 | 7/2020 | Ohno et al. | |
| 10,714,572 | B2 | 7/2020 | Hori | |
| 10,770,550 | B2 | 9/2020 | Wada et al. | |
| 10,858,757 | B2 | 12/2020 | Tanaka et al. | |
| 10,879,359 | B2 | 12/2020 | Masumoto et al. | |
| 11,114,295 | B2 | 9/2021 | Aigo et al. | |
| 11,373,868 | B2 | 6/2022 | Itoh | |
| 11,459,670 | B2 | 10/2022 | Hori et al. | |
| 11,721,547 | B2 | 8/2023 | Hecht et al. | |
| 11,735,642 | B2 | 8/2023 | Schulze et al. | |
| 2005/0205872 | A1* | 9/2005 | Hallin ................. | H10P 14/2904 257/77 |
| 2010/0199910 | A1* | 8/2010 | Watanabe ............. | C30B 23/025 117/88 |
| 2022/0189761 | A1* | 6/2022 | Ravi ................... | H10P 14/2904 |

* cited by examiner

SILICON CARBIDE EPITAXY

FIELD

This invention relates to semiconductor device silicon carbide manufacture, and in particular to the growth of low defect silicon carbide epitaxy.

BACKGROUND

The use of wide bandgap (WBG) semiconductors has increased dramatically in recent years in power electronics. Their ability to operate efficiently at higher voltages, powers, temperatures, and switching frequencies has enabled reduced cooling requirements, lower part counts, and the use of smaller passive components. WBG-based power electronics can further reduce the footprint and potentially the system cost of various renewable energy electrical equipment such as motor drivers and inverters.

Among the WBG semiconductors for power electronics, Silicon Carbide (SiC) has now been increasingly used for high voltage drivers (>1200V) whereas Gallium Nitride (GaN) has been experiencing increased use in both higher power and higher frequency applications. From the substrate standpoint, 4H-Silicon carbide (SiC) Single Crystal Substrates have been used for both SiC and GaN devices since SiC and GaN epitaxial layers can be grown with reduced defects on SiC substrates. The GaN substrate, on the other hand, is very expensive to grow defect free and has not kept up with scaling size increases afforded with SiC substrates. While the SiC substrate quality has dramatically improved in the recent years, the cost has not come down since substrate fabrication is a complex process starting with vapor phase ingot growth followed by ingot cropping, then wire sawing of individual wafers, and finally grinding and polishing of the substrate, and as of now, there has been no proven practical method to eliminate any of these foregoing steps.

As a semiconductor substrate for WBG semiconductors is being produced and devices that use high currents are fabricated, defects play a larger role and are magnified because die sizes are larger and any defect will contribute to more significant yield loss and potential lower reliability. Therefore, to maximize die yield, any cost reduction activity regarding the substrate is paramount while also maintaining low defect densities in the active epitaxial layer.

Accordingly, it is desirable to produce SiC wafers or substrates with low defects as well as growing SiC epitaxial layers with high quality surface morphology and low defect density.

BRIEF DESCRIPTION OF THE DRAWINGS

Various features of the system are set forth with particularity in the appended claims. The embodiments herein, can be understood by reference to the following description, taken in conjunction with the accompanying drawings, in which:

DETAILED DESCRIPTION

Figure 1:
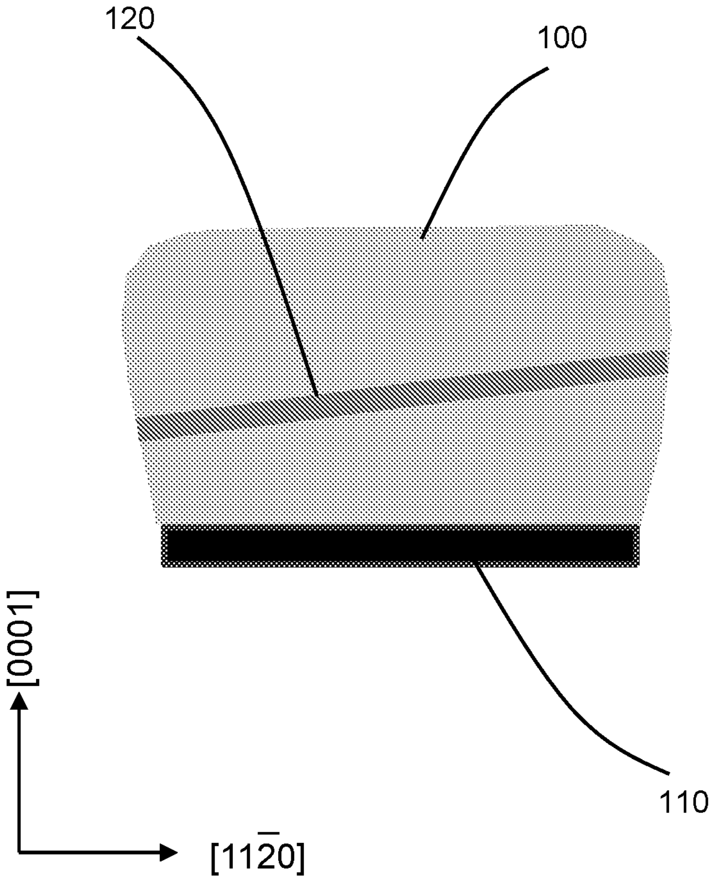
FIG. 1 is an illustration of a Silicon carbide boule grown from a seed crystal using a sublimation growth process.

The following description of embodiment(s) is merely illustrative in nature and is in no way intended to limit the invention, its application, or uses.

For simplicity and clarity of the illustration(s), elements in the figures are not necessarily to scale, are only schematic, are non-limiting, and the same reference numbers in different figures denote the same elements, unless stated otherwise. Additionally, descriptions and details of well-known steps and elements are omitted for simplicity of the description. Notice that once an item is defined in one figure, it may not be discussed or further defined in the following figures.

The terms “first”, “second”, “third” and the like in the Claims or/and in the Detailed Description are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Processes, techniques, apparatus, and materials as known by one of ordinary skill in the art may not be discussed in detail but are intended to be part of the enabling description where appropriate.

While the specification concludes with claims defining the features of the invention that are regarded as novel, it is believed that the invention will be better understood from a consideration of the following description in conjunction with the drawing figures, in which like reference numerals are carried forward.

This invention is related to the epitaxy of silicon carbide (SiC) as a Wide Band Gap (WBG) material for the fabrication of semiconductor devices. The use of Silicon Carbide as a material for semiconductor devices has grown significantly due to its unique properties for withstanding high voltages and high temperatures. Thus, SiC has been deployed for power devices since its breakdown voltage is about ten times higher than silicon and the thermal conductivity is about three time higher than silicon. The high breakdown voltages enable the development of high voltage devices such as SBD (Schottky Barrier Diodes) and MOSFETs by reducing the thickness of the drift region and thereby reducing the $RDS_{on}$, which is a key parameter for high voltage devices. Also, compared to silicon devices, SiC devices can operate at higher switching frequencies thereby reducing switching losses. Thus, SiC can be operated at higher temperatures due to better thermal conductivity and has higher heat dissipation for removing heat which are desirable device characteristics.

The epitaxial growth process for SiC is quite complicated because of the crystalline structure of SiC which has an atomic crystal that consists of 50% Silicon and 50% Carbon. Each carbon atom has exactly four silicon atoms as neighbors and vice versa, resulting in a very strong C—Si bond strength of approximately 4.6 eV. Unlike silicon, the silicon carbide crystal has lattice sites which differ in their structures of nearest neighbors of silicon and carbon atoms. These lattice sites can be either hexagonal or cubic sites. Thus, for silicon carbide, H stands for hexagonal lattices sites while C stands for cubic lattice sites. Thus, cubic and hexagonal lattice sites differ in their number of second nearest neighbors which results in the different electric fields at the specific site.

In addition, silicon carbide as a material is an example for polymorphism, in which the SiC crystal can grow in a wide range of crystal structures, also known as the polytypes. Each polytype has different electrical, optical, thermal and mechanical properties that depend on the specific crystal structure. In the hexagonal close packed system for Siicon carbide, each polytype is defined by the Si—C bilayer stacking sequence along the c-axis. Thus, each polytype is labeled after the number of stacking Si—C bi-layers in the unit cell and the lattice structure. Some of the common polytypes for SiC are 3C—SiC, 2H—SiC, 4H—SiC and 6H—SiC.

For power devices, the polytype that has been chosen to be used is the 4H—SiC because of its superior electrical properties such as high breakdown voltage and high electron mobility. In addition, it is possible to grow high quality, single crystalline 4H—SiC wafers of large diameter (up to 200 mm) with low defect concentrations. The process of producing SiC wafers starts with the growth of SiC bulk crystals (called boules) grown from a seed crystal using the sublimation growth method, typically along the [0001] direction. Since the growth rate of the bulk crystal of SiC is quite slow and prone to defects the usable length of the SiC boules is only between 30-50 mm. The process of producing SiC wafers from the SiC boules consist of slicing wafer that are sliced off-axis from the cylindrical boules. In SiC, the resulting off-axis 4H—SiC wafer is usually tilted 4 degrees towards the [1120] or [0001] direction, to produce wafers with silicon carbide epitaxy with low defect density, as will be subsequently described.

FIG. 1 is an illustration of a Silicon carbide boule 100 grown from a seed crystal 110 using a sublimation growth process. The crystal growth axis is shown in the reference axis in FIG. 1. The silicon carbide boule is sliced at an off-cut angle to produce silicon carbide wafer 120 as shown in FIG. 1. It should be noted that the angle as shown in FIG. 1 is not accurate but may be exaggerated to illustrate the off-cut angle. Typically, the off-cut angle of silicon carbide wafer 120 is 4 degrees toward the [0001] direction.

Figure 2A:
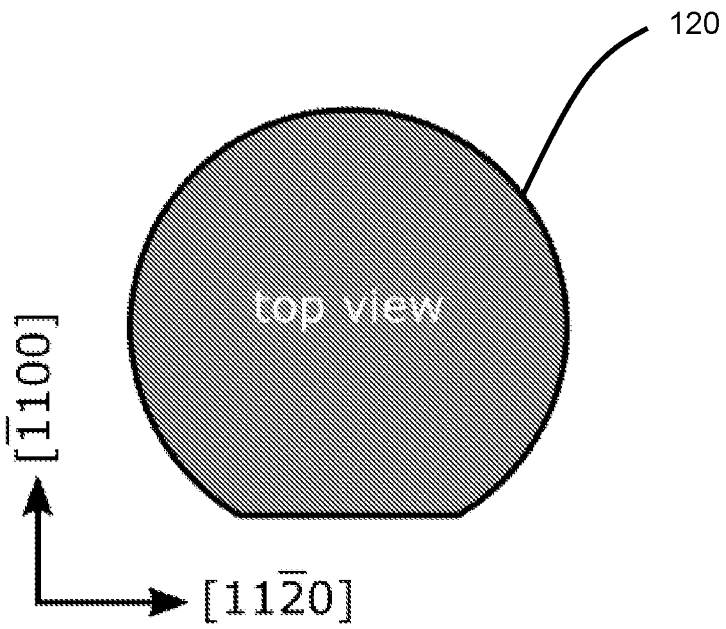
FIG. 2A is an illustration of the top view of an off-cut SiC wafer in accordance with an example embodiment.

FIG. 2A is an illustration of the top view of an off-cut SiC wafer 120 in accordance with an example embodiment. Off-cut SiC wafer 120 is produced from silicon carbide boule 100 as shown in FIG. 1. The reference axis for the off-axis SiC (0001) wafer is also shown in FIG. 2A.

Figure 2B:
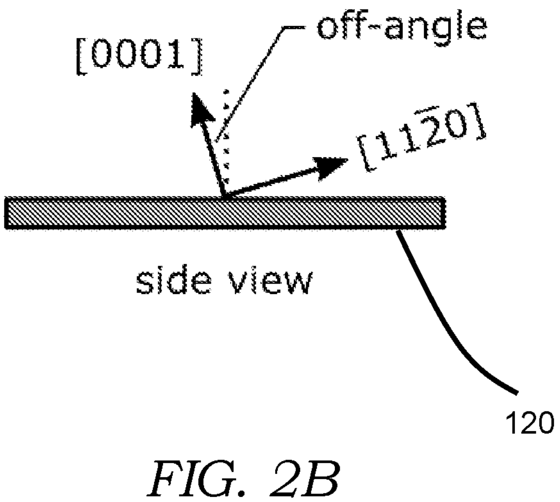
FIG. 2B is an illustration of a side view of the off-cut SiC wafer in accordance with an example embodiment.

FIG. 2B is an illustration of a side view of an off-cut SiC wafer 120 in accordance with an example embodiment. Off-cut SiC wafer 120 is produced from silicon carbide boule 100 of FIG. 1. The reference axis for the off-axis SiC (0001) wafer is also shown in FIG. 2B.

Figure 3:
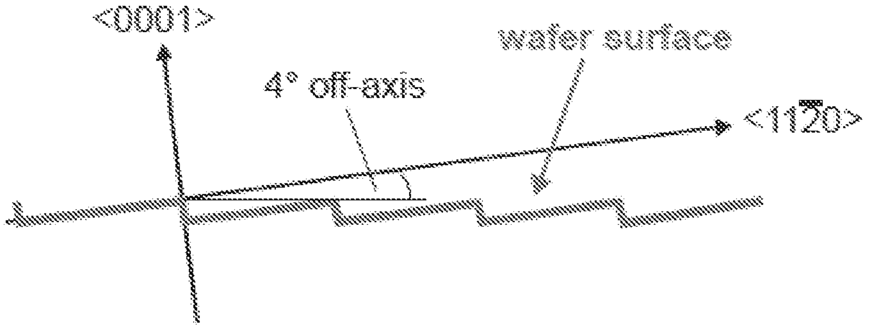
FIG. 3 is an illustration of an off-axis 4H—SiC(0001) wafer tilted 4 degrees towards the [1120] or [0001] direction in accordance with an example embodiment.

FIG. 3 is an illustration of off-axis 4H—SiC(0001) wafer 120 tilted 4 degrees towards the [1120] or [0001] direction in accordance with an example embodiment. The off-axis cut of the off-cut SiC wafer 120 is due to the effort to preserve the polytype during the homoepitaxial growth process. In one embodiment, a surface 200 of off-cut SiC wafer 120 from the boule results in a series of ledges or terraces which are about 14 nm in length and about 1 nm in height. Conversely, if there is no off-axis wafer cut, the stacking information of the polytype is lost and different configurations or arrangements of the atoms are possible during the epitaxial growth process. In the example embodiment, the step edges of the terraces which arise on surface 200 of the off-axis off-cut SiC wafer 120, only a single bond configuration is possible and the stacking information is transferred along the crystal growth direction. In the example embodiment of the off-oriented substrate, the surface steps as disclosed herein above serve as the template for the replication of the underlying polytype and is called "step-controlled epitaxy" or step flow growth, resulting in the growth of high quality epitaxial layers.

Figure 4A:
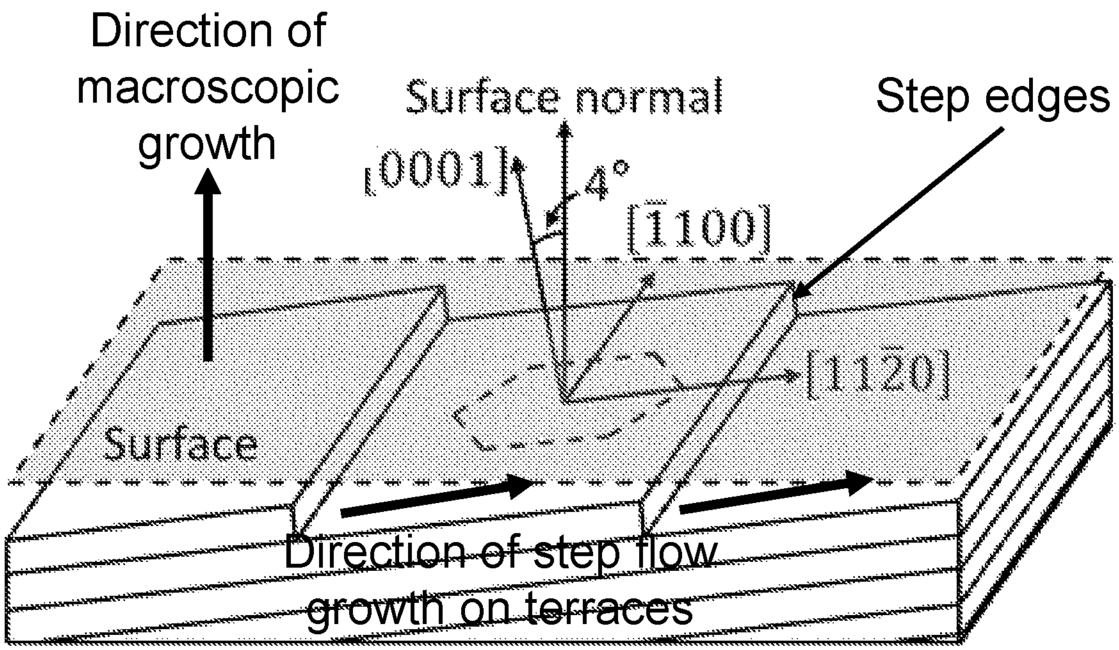
FIG. 4A is an illustration showing epitaxial growth on a surface of the off-cut SiC wafer by the process of step flow growth in accordance with an example embodiment.

FIG. 4A is an illustration showing epitaxial growth on surface 200 of off-cut SiC wafer 120 by the process of step flow growth in accordance with an example embodiment. The silicon and carbon atoms replicate the underlying polytype in the steps or terraces as indicated by the arrow showing the layer growth direction. As the polytype is replicated by the steps, the epitaxial layer grows in thickness and the macroscopic growth direction is along the [0001] direction or the c-axis.

Figure 4B:
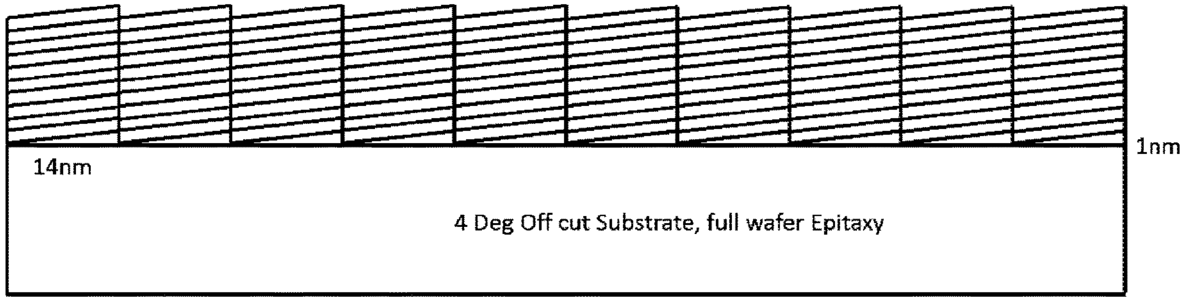
FIG. 4B is an illustration of the epitaxial growth of silicon carbide on a surface of the off-cut SiC wafer by the step-controlled epitaxy in accordance with an example embodiment.

FIG. 4B is an illustration of the epitaxial growth of silicon carbide on surface 200 of off-cut SiC wafer 120 by the step-controlled epitaxy on the steps or terraces of the surface where integration of silicon and carbon atoms that replicates the underlying polytype occurs in accordance with an example embodiment. Off-cut SiC wafer 120 has a very large number of surface terraces or steps after epitaxial growth such that high quality homoepitaxy of silicon carbide layers is achieved. Multiple layers of silicon carbide can be grown on surface 200 of the off-cut SiC wafer 120 with different thicknesses and doping levels for the fabrication of different semiconductor devices. The silicon carbide epitaxial growth can be affected by multiple parameters resulting in numerous defects that can affect the performance and reliability of the devices fabricated using this growth method.

The epitaxial growth process for silicon carbide comprises the use of different precursor gases for the source of the silicon and carbon in forming a SiC epitaxial layer in a CVD (Chemical Vapor Deposition) reactor at high temperatures. Typically, precursor gases for silicon comprise Silane ($SiH_4$) and TCS (trichlorosilane) and the precursor gases for carbon are ethylene ($C_2H_4$) and propane ($C_3H_8$). The system may also use carrier gases such as $H_2$ and also dopant gases for doping the epitaxial layer. The typical epitaxial growth temperature is between (1500-1800)° C. and the growth pressure is between (50-200) mbar.

In order to grow high quality silicon carbide epitaxy, it is important to control the process parameters that affect the incorporation of the silicon and carbon atoms while maintaining the underlying polytype in the step flow growth process as explained herein above. Some of the key parameters that affect the homoepitaxial growth process includes the process temperature, pressure, carbon to silicon ratio (C/Si ratio) among others. The C/Si ratio is an extremely important parameter and the range of the variation of this parameter is necessary to obtain a SiC epitaxial layer with good surface morphology and low defect density. If the C/Si ratio is too high, surface morphological defects can be generated while if the C/Si ratio is too low, the surface morphology can suffer by the formation of severe macro-steps and silicon droplets. Thus, it is important to control these key parameters within a close range to ensure growth of silicon carbide epitaxial layers with good surface morphology and low defect density. Some of the defects that form in a SiC epitaxial layer are threading screw dislocations, threading edge dislocations, basal plane dislocations, stacking faults, micropipes among others. In addition, surface morphological defects such as triangle defects, carrot defects among others can occur. These defects may also propagate from the surface of the substrate to the surface of the epitaxial layer and contribute to different failure mechanisms. These defects can be very detrimental to performance and reliability in semiconductor devices that are fabricated on or in these epitaxial layers. Thus, device breakdown voltages may suffer, the leakage current may increase beyond acceptable values, or the reliability of a device may be unacceptable due to these defects. Thus, there is great interest in producing SiC wafers or substrates with low surface defects as well as growing SiC epitaxial layers with high quality surface morphology and low defect density.

Described herein is a method for growing of silicon carbide epitaxy with low defect density to support the fabrication of semiconductor devices using SiC wafers with good performance, high reliability, and low cost. The method of growing low defect silicon carbide epitaxial layer is described with an example embodiment.

Figure 5:
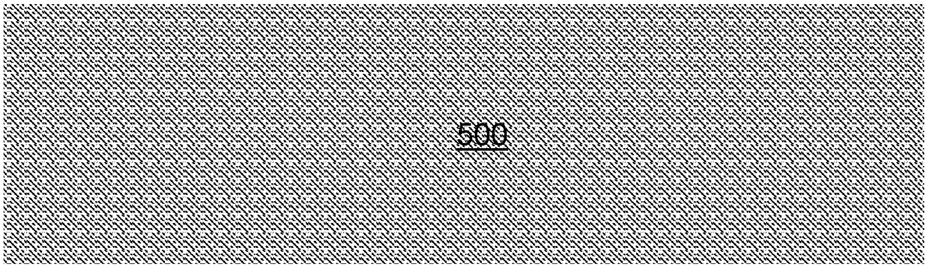
FIG. 5 is an illustration of a SiC (Silicon Carbide) substrate in accordance with an example embodiment.

FIG. 5 is an illustration of a SiC (Silicon Carbide) substrate 500 in accordance with an example embodiment. In the example embodiment, SiC substrate 500 is a silicon carbide wafer that is typically off-cut by 4 degrees, as explained previously. SiC substrate 500 is used to implement the method of growing low defect density SiC epitaxial layers for the fabrication of semiconductor devices such as SBD (Schottky Barrier Diode), MOSFETS (Metal Oxide Semiconductor Field Effect Transistor), IGBT (Insulated Gate Bipolar Transistor) among other devices. While silicon carbide substrate 500 is used in the example embodiment, the invention can be implemented in other semiconductor substrates such as gallium nitride, gallium arsenide, indium phosphide, silicon, silicon on insulator (SOI) among others. In addition, the invention may be used in other semiconductor devices such as photonic devices, lasers, light emitting diodes, RF devices, among others.

In one embodiment, silicon carbide substrate 500 is a crystalline 4H silicon carbide wafer with a preferred crystalline orientation of <0001> with an offcut towards <1120> of 4 degrees. In one embodiment, a thickness of silicon carbide substrate 500 is in the range of 300-400 microns. In one embodiment, silicon carbide substrate 500 may be a single side polished or double side polished wafer and can be considered as the parent wafer, for considerations that are described in subsequent process steps in the implementation of the current invention. In one embodiment, silicon carbide substrate 500 is the basic platform on which the example embodiment is implemented to support the process flow in accordance with the current invention. In one embodiment, silicon carbide substrate 500 is a reusable semiconductor substrate that is used for fabrication of semiconductor devices multiple times in accordance with the current invention.

Figure 6:
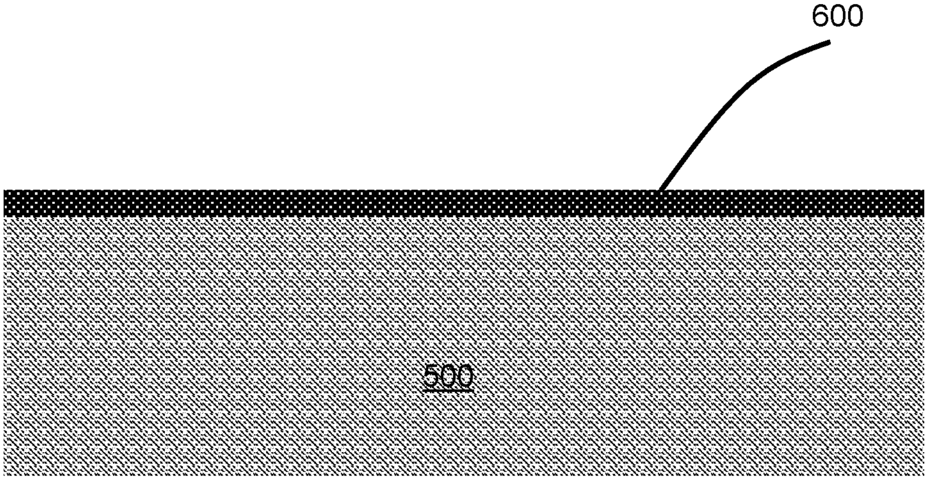
FIG. 6 is an illustration of a hard mask layer overlying the silicon carbide substrate in accordance with an example embodiment.

FIG. 6 is an illustration of a hard mask layer 600 overlying silicon carbide substrate 500 in accordance with an example embodiment. Hard mask layer 600 is deposited over the surface of silicon carbide substrate 500. Hard mask layer 600 is deposited using techniques such as CVD (Chemical Vapor Deposition), LPCVD (low pressure chemical vapor deposition), PECVD (Plasma Enhanced Chemical Vapor Deposition), APCVD (Atmospheric Pressure Chemical Vapor Deposition), SACVD (Sub Atmospheric Chemical Vapor Deposition) among other techniques. PVD (Physical Vapor Deposition), or ALD (Atomic layer Deposition) may also be used for hard mask layer 600. In the example implementation, hard mask layer 600 comprises PECVD (Plasma Enhanced Chemical Vapor Deposition) silicon oxide. The thickness of silicon oxide hard mask layer 600 is selected based on the requirements of subsequent processing steps as described in the example implementation and is in the range of 100-3000 nm. The thickness of hard mask layer 600 is determined by the specific requirements of the implementation and is well known to those skilled in the art.

Figure 7:
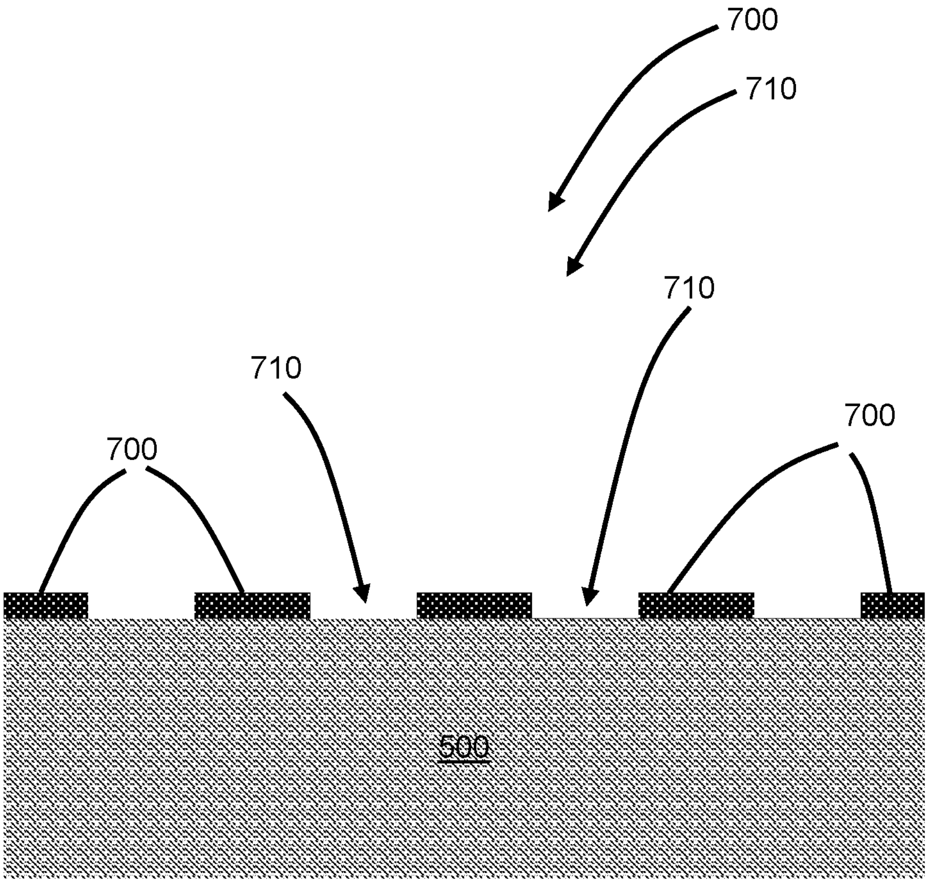
FIG. 7 is an illustration of a plurality of openings formed in the hard mask layer in accordance with an example embodiment.

FIG. 7 is an illustration of a plurality of openings 710 formed in hard mask layer 600 of FIG. 6 in accordance with an example embodiment. In one embodiment, hard mask layer 600 of FIG. 6 is deposited overlying the surface of silicon carbide substrate 500 and is patterned to subsequently support the formation of plurality of openings 710 that expose areas of a surface of silicon carbide substrate 500. A remaining patterned hard mask 700 is formed after the patterning process. Plurality of openings 710 are formed in hard mask layer 600 of FIG. 6 by using methods of lithography and etching techniques commonly used in the semiconductor industry. In one embodiment, remaining patterned hard mask 700 is left in areas to protect silicon carbide substrate 500 from being etched. The shape of plurality of openings 710 are determined by the requirements of epitaxial growth in subsequent steps in the implementation of the example embodiment. In one embodiment, plurality of openings 710 may be in the shape of squares or rectangles. In another embodiment, plurality of openings 710 may be in the shape of triangles, hexagons or diamonds. The size of plurality of openings 710 may be in the range of (20-500) nm and determined by the requirements of epitaxial overgrowth in the subsequent steps of fabrication of the example device. In one embodiment, spacing between adjacent openings of plurality of openings 710 is determined by the requirements of epitaxial overgrowth in the subsequent steps of fabrication of the example device and can be in the range of 500 nm to 5 micrometers. Plurality of openings 710 are generated on a surface of hard mask layer 600 of FIG. 6 by using lithography techniques that are well known to those skilled in the art. In one embodiment, plurality of openings 710 are implemented using optical lithography using UV, DUV or EUV. In another embodiment, plurality of openings 710 are implemented using an electron beam direct write technique. In yet another embodiment, plurality of openings 710 are implemented using Nano-Imprint Lithography (NIL).

In one example embodiment, plurality of openings 710 are implemented by first coating a surface of hard mask layer 600 of FIG. 6 with a photosensitive layer of photoresist, which may be positive or negative in its chemistry. In the example embodiment, positive photoresist is used in coating the surface of hard mask layer 600 from FIG. 6. An optical tool called a stepper is used to transfer the pattern of openings on to the positive photoresist layer using chemistries that are well known to those skilled in the art. The choice of the photoresist layer, thickness of the photoresist layer, the exposure and develop times for the subsequent chemical steps are well known to those skilled in the art and determined by the requirements of accurate pattern transfer from the photoresist layer to hard mask layer 600 to subsequently form plurality of openings 710 and leave patterned hard mask 700. The stepper transfers the pattern of plurality of openings 710 to cover the surface of hard mask layer 600 overlying silicon carbide substrate 500.

After the pattern transfer is completed using lithography, the next step is the patterning of hard mask layer 600 of FIG. 6 using etching techniques to selectively remove the hard mask layer 600 of FIG. 6 overlying silicon carbide substrate 500 thereby leaving patterned hard mask 700 overlying silicon carbide substrate 500. The selective removal of hard mask layer 600 to form patterned hard mask 700 may use Reactive Ion Etching (RIE). Different gases may be used to form a plasma to selectively remove the portions of hard mask layer 600 exposed by the patterned photoresist. The choice of gases for the RIE is determined by hard mask layer 600 of FIG. 6 used in the implementation. In the example embodiment, with a silicon oxide used as hard mask layer 600, fluorine-based chemistries such as $SF_6$, $CF_4$, $CHF_3$, and other gases may be used in the RIE. Accordingly, in the example embodiment with silicon oxide as hard mask layer 600, plurality of openings 710 are etched in hard mask layer 600 of FIG. 6 using a fluorine-based chemistry that exposes the surface of silicon carbide substrate 500. Patterned hard mask 700 remains in areas overlying the surface of silicon carbide substrate 500 to protect or mask the surface of silicon carbide substrate 500 from etching. After patterning hard mask layer 600, the photoresist is stripped using techniques well known to those skilled in the art and may be dry, wet or a combination of dry and wet processing.

Figure 8:
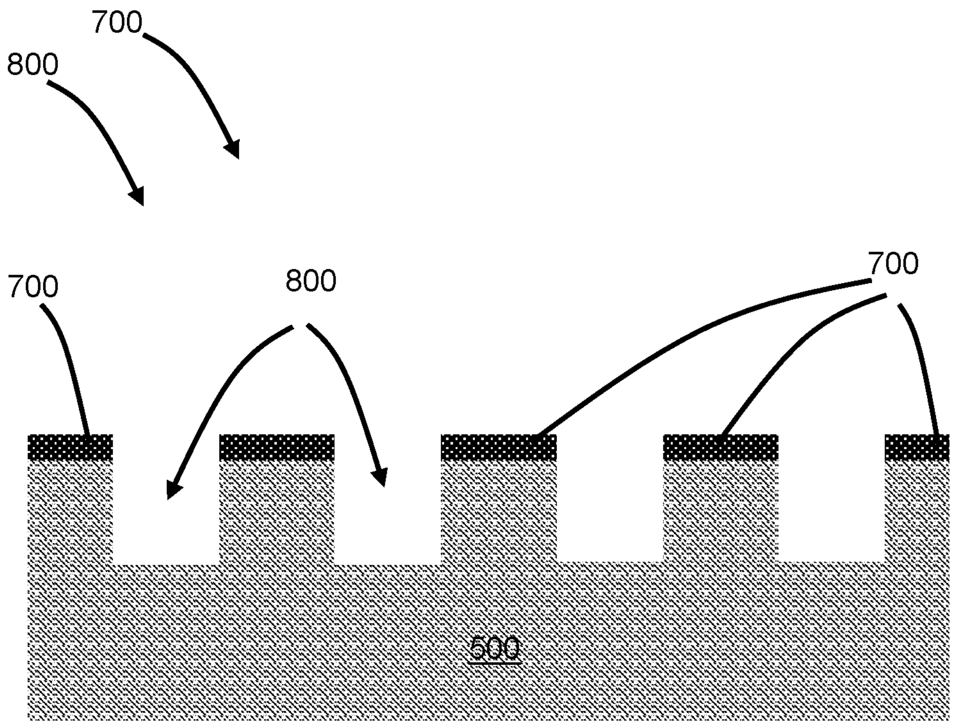
FIG. 8 is an illustration of openings formed in the silicon carbide substrate in accordance with an example embodiment.

FIG. 8 is an illustration of openings 800 formed in silicon carbide substrate 500 in accordance with an example embodiment. Openings 800 are formed after hard mask layer 600 of FIG. 6 is etched to form plurality of openings 710 in FIG. 7. In one embodiment, the surface of silicon carbide substrate 500 exposed by plurality of openings 710 of FIG. 7 is then etched to form openings 800 using RIE (Reactive Ion Etching). In one embodiment, silicon carbide substrate 500 is etched using patterned hard mask 700 of FIG. 7 to form openings 800 with an aspect ratio that is determined by the requirements of epitaxial growth in subsequent processing of the example device. It should be noted that other substrates can be used similarly as disclosed herein above. In one embodiment, an inductively coupled plasma (ICP) with high density may also be used to form openings 800 in silicon carbide substrate 500.

Figure 9:
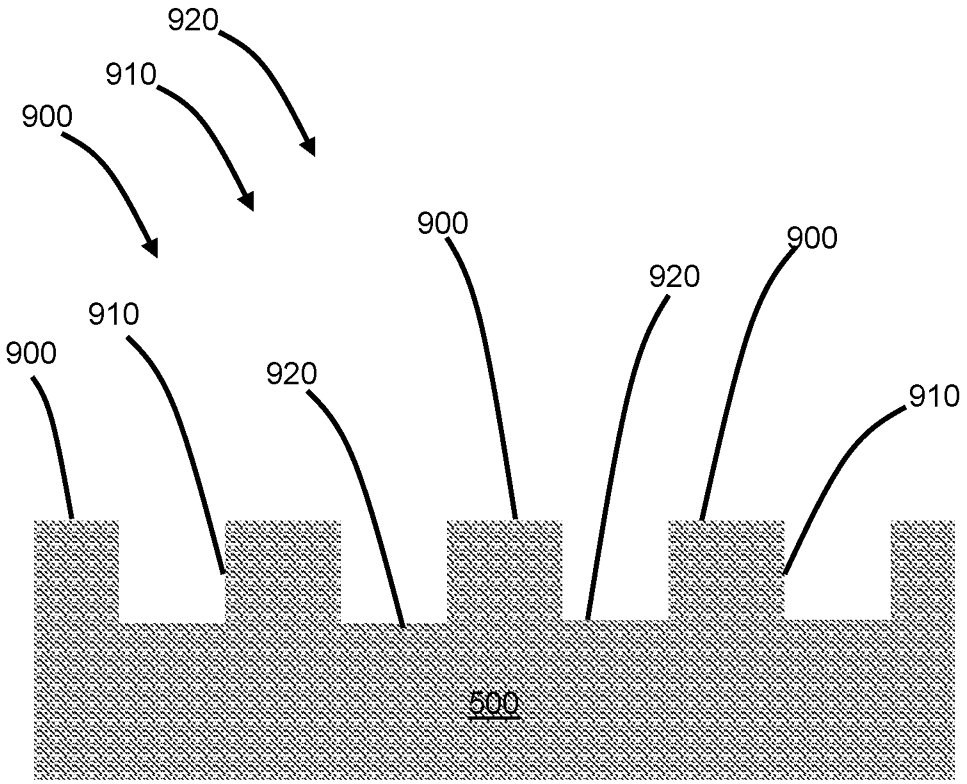
FIG. 9 is an illustration of a plurality of pillars formed in the silicon carbide substrate in accordance with an example embodiment.

FIG. 9 is an illustration of a plurality of pillars 900 formed in silicon carbide substrate 500 in accordance with an example embodiment. Plurality of pillars 900 are shown after the removal of patterned hard mask 700 of FIG. 8. In an example embodiment, patterned hard mask 700 of FIG. 8 is removed by using wet or dry chemical etching and is determined by the choice of hard mask layer material. In the example embodiment, patterned hard mask 700 of FIG. 8 comprises a PECVD silicon oxide that is removed using a wet chemistry of BHF (Buffered Hydrofluoric Acid). Other solutions for etching PECVD silicon oxide may include HF (Hydrofluoric Acid) in various dilutions in water. Silicon carbide substrate 500 is then cleaned in preparation for the next step in the fabrication of the example device. In one embodiment, the pattern of plurality of pillars 900 are shaped as triangles or hexagons to expose (1120) or equivalent crystal planes since these orientations facilitate high quality epitaxial overgrowth with low defect density in subsequent processing steps in accordance with the current invention. In one embodiment, a height 910 of plurality of pillars 900 is in the range of (500-5000) nm and spacings 920 between adjacent pillars is in the range of (500-5000) nm and is determined by the requirements of silicon carbide epitaxy as subsequently described herein.

Subsequent figures disclosed herein below will describe an exfoliation process to separate one or more high quality epitaxial layers from substrate 500. One or more devices can be formed in or on the one or more high quality epitaxial layers. The separation of the one or more high quality epitaxial layers allows the reuse of substrate 500 in wafer processing of the formation of new devices. Alternatively, in one embodiment, there may only be need for a process to grow one or more high quality epitaxial layers attached to substrate 500 without exfoliation. The process for growing high quality epitaxial layers attached to substrate 500 will comprise a step of growing epitaxy by lateral epitaxial overgrowth on substrate 500 with plurality of pillars 900. In one embodiment, 4H—SiC growth will occur along the <1120> or <1100> directions due to the lateral epitaxial growth. In one embodiment, the lateral epitaxial overgrowth comprises growth from sidewalls of each pillar of the plurality of pillars 900. In one embodiment, lateral epitaxial overgrowth from the sidewalls from each pillar of the plurality of pillars 900 will merge comprising merged epitaxial lateral overgrowth (MELO) that is high quality low defectivity epitaxy. In one embodiment, the merged epitaxial lateral overgrowth (MELO) from the lateral epitaxial overgrowth process will form a continuous epitaxial layer overlying a vertical 4H—SiC growth in spacing 920 between plurality of pillars 900 due to step flow growth. This merged epitaxial lateral growth is possible by controlling height 910 of plurality of pillars 900 and spacings 920 between adjacent pillars in plurality of pillars 900 to form a high quality SiC epitaxial layer with low defect density. In one embodiment, a kiss polish is performed as disclosed herein below that exposes a surface of first epitaxial layer that comprises a surface of the merged epitaxial lateral overgrowth (MELO) epitaxy and a top surface of each pillar of plurality of pillars 900. In the example embodiment, the quality of the first epitaxial layer is improved by increasing a ratio of the surface of the merged epitaxial lateral overgrowth (MELO) epitaxy to a combined area of the top surface of each pillar of plurality of pillars 900 thereby decreasing defect propagation in the formation of subsequent epitaxial layers. In one embodiment, subsequent epitaxial layers are formed using standard epitaxy processes that are configured for vertical epitaxial growth. In one embodiment, substrate 500, the first epitaxial layer, and subsequent epitaxial layers are all single crystal identical to substrate 500.

Figure 10:
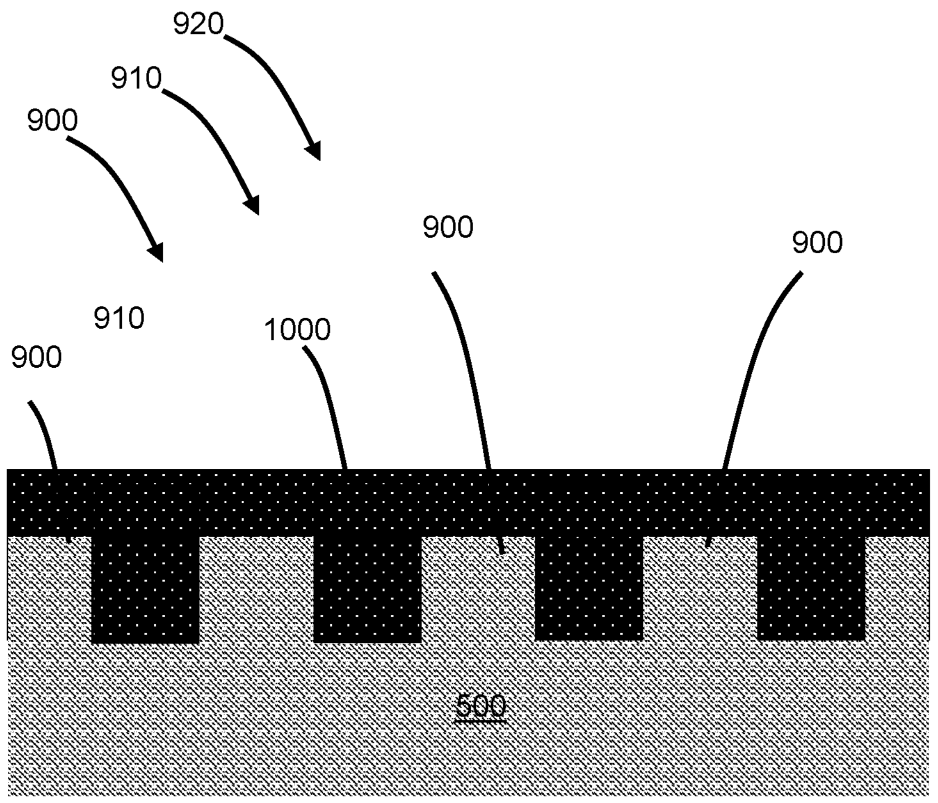
FIG. 10 in an illustration of a refill layer formed over the plurality of pillars and in the plurality of openings after removal of the patterned hard mask in accordance with an example embodiment.

FIG. 10 in an illustration of a refill layer 1000 formed over plurality of pillars 900 and in plurality of openings 710 after removal of patterned hard mask 700 in accordance with an example embodiment.

In one embodiment, refill layer 1000 is formed overlying plurality of pillars 900 and in plurality of openings 710 after removal of patterned hard mask 700 as shown in FIG. 9. In one embodiment, refill layer 1000 is a carbon layer. In another embodiment, refill layer 1000 is a polymer layer that is deposited and then subsequently converted into a carbon layer. In another embodiment, refill layer 1000 is a tantalum carbide layer. In general, refill layer 1000 is a layer that can subsequently be targeted specifically after further wafer processing is performed. For example, refill layer 1000 can be selectively heated by laser in a subsequent step which will be described in further detail herein below.

Refill layer 1000 can be formed over plurality of pillars 900 and in plurality of openings 710 after removal of patterned hard mask 700 using different methods and processes.

In one embodiment, refill layer 1000 may be formed by spin coating a polymer layer and then subsequently converting it into a carbon layer by pyrolysis in an inert environment. In another embodiment, refill layer 1000 may be formed by CVD (Chemical Vapor Deposition) of a polymer layer such as Parylene and subsequently converting the deposited polymer layer into carbon by heating it at a high temperature of (900-1400°) C in an inert environment such as nitrogen. In another embodiment, refill layer 1000 may be formed by sputter deposition using a carbon target. Other methods of carbon deposition may include CVD (chemical vapor deposition) or ALD (Atomic layer Deposition) to form refill layer 1000.

In an example embodiment, refill layer 1000 is formed by spin coating a photoresist layer. The photoresist layer may be a positive polarity or negative photoresist. The choice of thickness of the photoresist layer is determined by the depth of plurality of pillars 900 and the final thickness of refill layer 1000 required by the process. The final thickness of the spin-coated photoresist is determined by the choice of the viscosity of the photoresist and the spread and spin speed during the dispense of the photoresist. The spin-coated photoresist is then baked in a nitrogen environment at a temperature of (90-120°) C to drive out solvents. In the pyrolysis process, silicon carbide substrate 500 having plurality of pillars 900 coated with a photoresist layer is placed in a furnace and heated to (900-1400°) C in an inert environment of nitrogen or in forming gas (nitrogen with hydrogen) to convert the spin-coated photoresist to carbon. During the pyrolysis process, the spin coated photoresist layer is converted into carbon while undergoing volumetric shrinkage. In the example embodiment, the pyrolysis process converts the spin-coated photoresist to carbon while also shrinking to form refill layer 1000. In another embodiment, the spin-coated photoresist layer thickness may be modified by etching in an oxygen plasma after the spin-coating and prior to the pyrolysis process.

Figure 11:
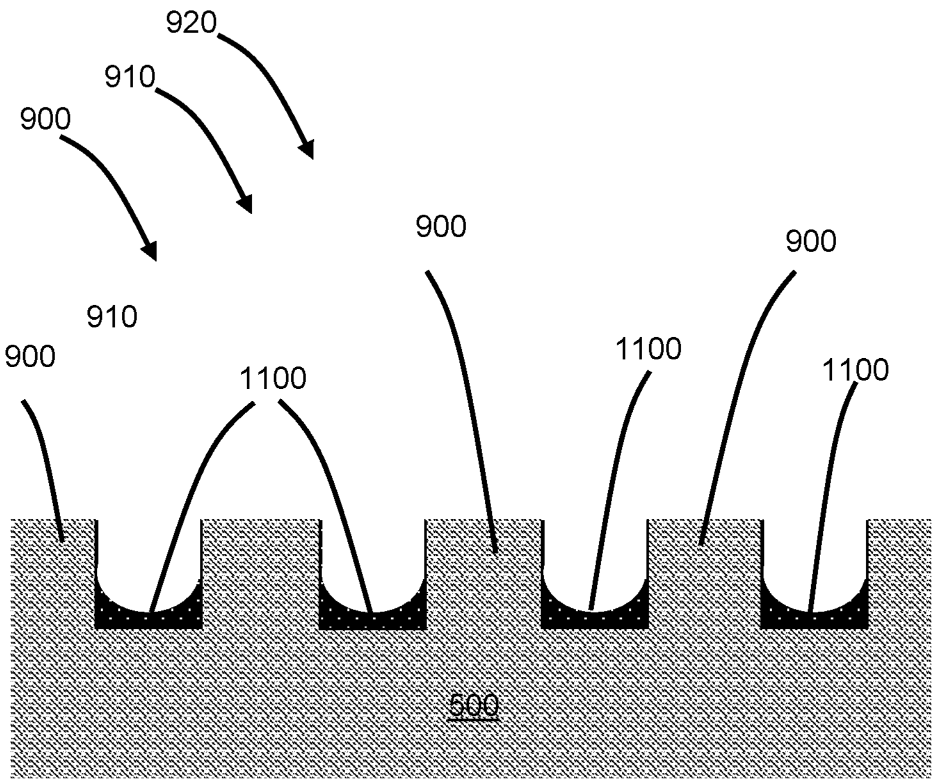
FIG. 11 is an illustration of a mask layer formed between the plurality of pillars in accordance with an example embodiment.

FIG. 11 is an illustration of a mask layer 1100 formed between plurality of pillars 900 in accordance with an example embodiment. Mask layer 1100 is used in the epitaxial growth processes overlying silicon carbide substrate 500 as will be subsequently described herein below. In one embodiment, mask layer 1100 is formed by reducing the thickness of refill layer 1000 from FIG. 10 using an etching process. In one embodiment, refill layer 1000 of FIG. 10 is a carbon layer and is etched using RIE (Reactive Ion Etching) to form mask layer 1100. In one embodiment, a height of refill layer 1000 is reduced to a predetermined height to form mask layer 1100. The predetermined height is achieved by RIE using oxygen, argon and other gases, as well known to those skilled in the art. In one embodiment, the predetermined height of mask layer 1100 is in a range of (300-1000) nanometers (nm).

Figure 12:
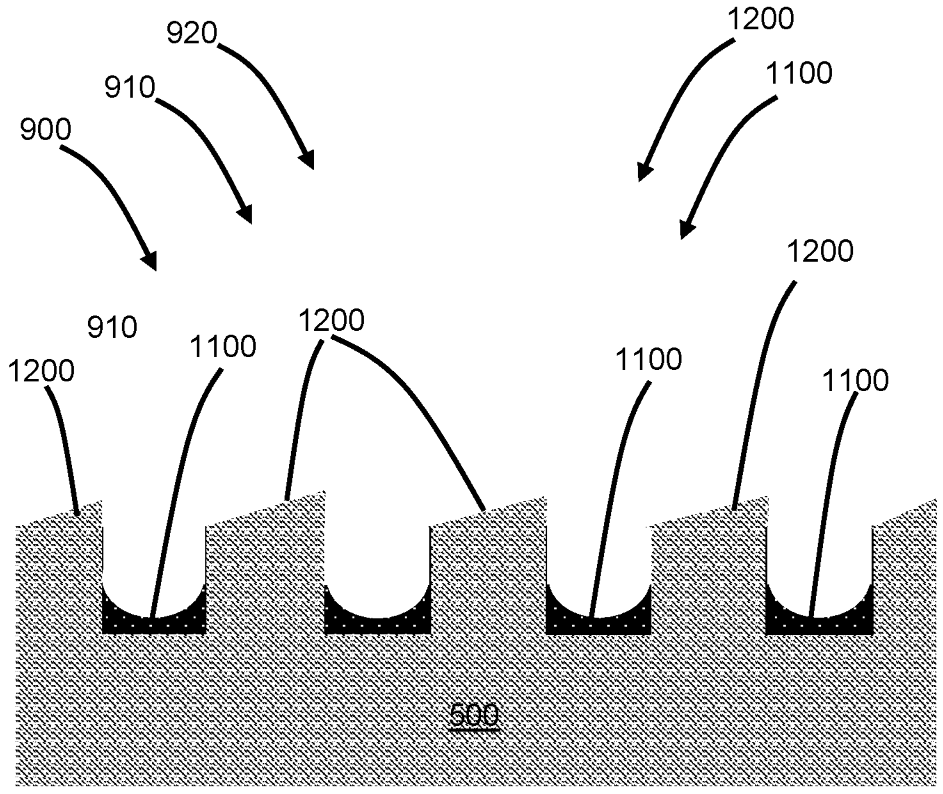
FIG. 12 is an illustration of the method for growing one or more low defect silicon carbide epitaxial layers in accordance with an example embodiment.

FIG. 12 is an illustration of the method for growing one or more low defect silicon carbide epitaxial layers in accordance with an example embodiment. The method of this low defect epitaxial growth comprises the step of placing the silicon carbide substrate 500 in an epitaxial reactor to initiate the epitaxial growth process. As previously described, precursor gases such as silane and TCS are used as the source of the silicon while gases such as propane and ethylene are used as the source of the carbon. In one embodiment, the epitaxial growth temperature is in a range of (800-1800°) C and a pressure in the epitaxial reactor is a range of (50-200) millibars. By carefully controlling the gas flow ratios, temperature, pressure and other parameters, the epitaxial growth process is initiated by the preferential step flow growth on the top surface of plurality of pillars 900 of FIG. 9. In FIG. 12, step flow growth regions 1200 grow by the incorporation of adatoms of silicon and carbon in an ordered manner maintain the 4H—SiC crystalline polytype in the terrace regions of plurality of pillars 900. The step flow growth of silicon carbide in spacings 920 of FIG. 9 is suppressed by mask layer 1100 as shown in FIG. 12. From an energy point of view, it is preferable to grow the epitaxial silicon carbide layer only above the top surface of plurality of pillars 900 of FIG. 9. In FIG. 12, step flow growth regions 1200 continue to grow in the silicon carbide epitaxial layer till all the terraces in each pillar of plurality of pillars 900 necessary to maintain the growth process are exhausted due to the limited size and surface area of each pillar of plurality of pillars 900. The size and thereby the surface area of each pillar of plurality of pillars 900 determine the height of each step flow growth region 1200.

Figure 13:
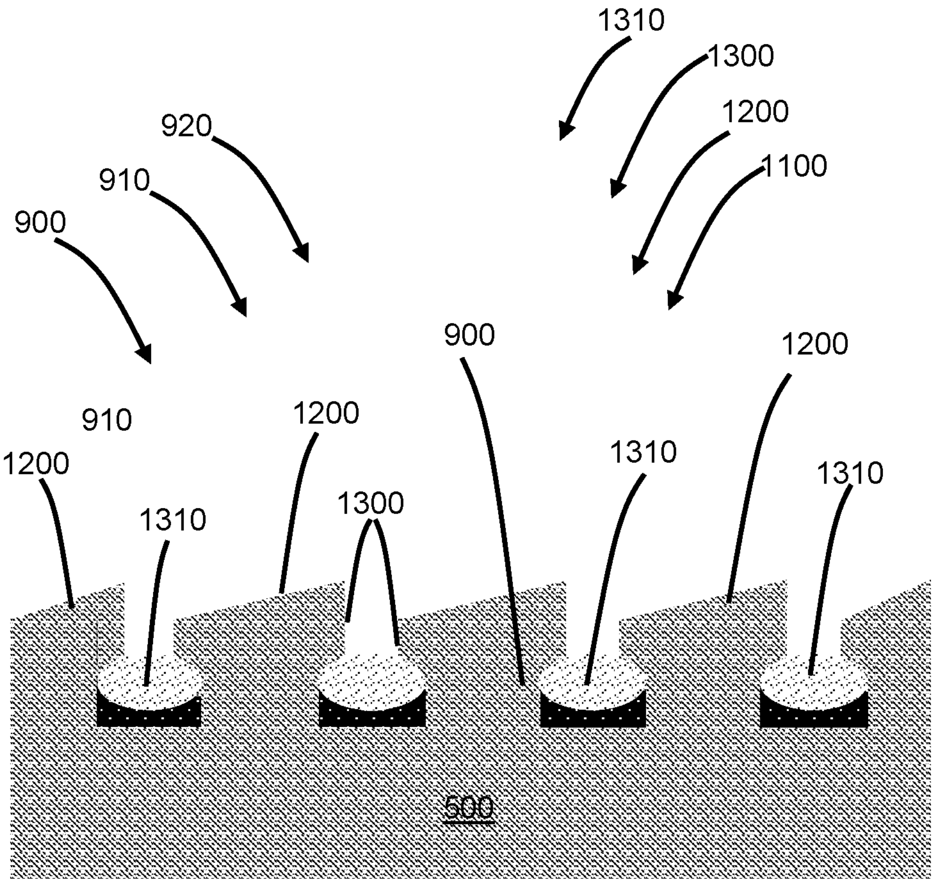
FIG. 13 is an illustration of an intermediate step of growing a low defective epitaxial layer over the surface of the SiC substrate in accordance with an example embodiment.

FIG. 13 is an illustration of an intermediate step of growing a low defective epitaxial layer over the surface of SiC substrate 500 in accordance with an example embodiment. In the epitaxial reactor, the silicon carbide grows according to the crystalline orientation of the exposed regions of silicon carbide substrate 500. As already described previously, the silicon carbide growth on the top surface of plurality of pillars 900 is completed when the number of step or terraces on the top surface of plurality of pillars 900 is exhausted resulting in step flow growth regions 1200 of FIG. 12. In the next phase of the epitaxial growth, lateral epitaxial growth of 4H—SiC from the vertical sidewalls of plurality of pillars 900 occurs in addition to the vertical growth of polycrystalline 3C-silicon carbide overlying mask layer 1100 between plurality of pillars 900. In one embodiment, a height of plurality of pillars 900 of FIG. 12 is configured to be greater than a height of the vertical growth of polycrystalline 3C-silicon carbide that partially or completely overlies mask layer 1100. In FIG. 13, lateral epitaxial growth layer 1300 grows along the <1120> direction while polycrystalline 3C layer 1310 grows in the <1000> direction on the surface of mask layer 1100. By modulation of the growth parameters of temperature, gas precursors, and pressure, a high quality epitaxial layer is grown in lateral epitaxial growth layer 1300 with very low defect density. As the epitaxial layer growth process continues, the gap between plurality of pillars is reduced by the formation of a high quality (low defect density) lateral epitaxial layer growing from the sidewalls of plurality of pillars 900.

Figure 14:
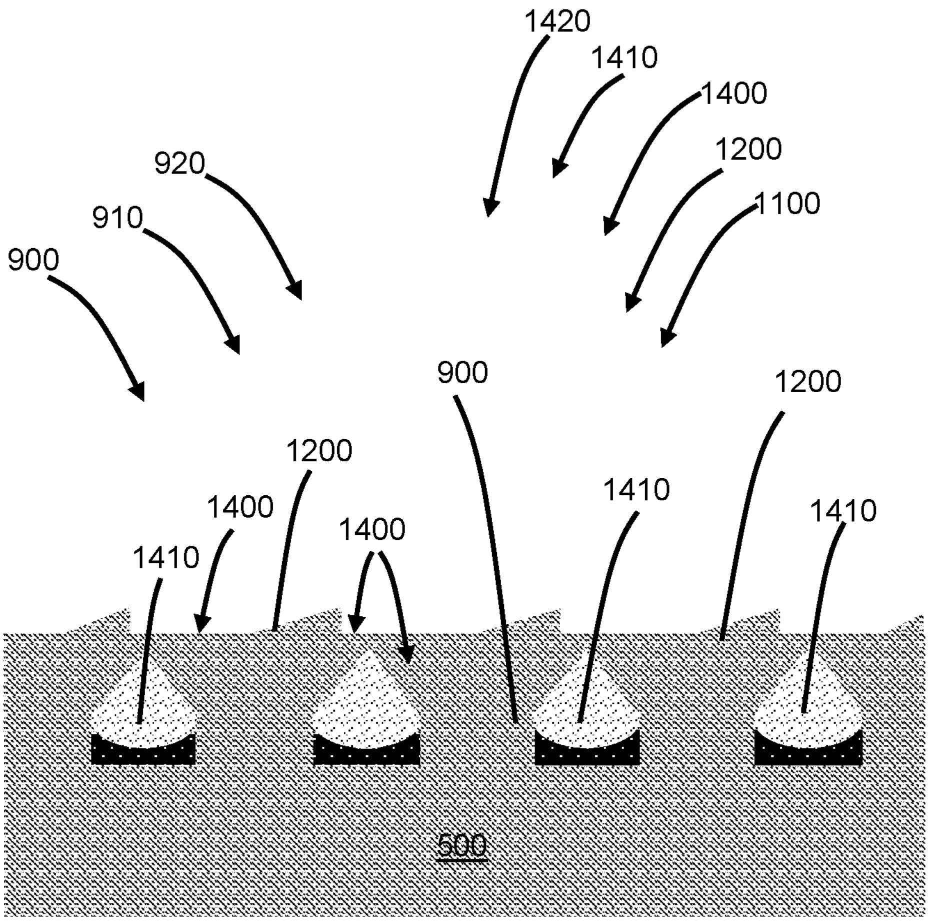
FIG. 14 is an illustration of the merging of the lateral epitaxial growth layers to form a merged epitaxial lateral overgrowth (*MELO*) layer in accordance with an example embodiment.

FIG. 14 is an illustration of the merging of the lateral epitaxial growth layers 1300 of FIG. 13 to form a merged epitaxial lateral overgrowth (MELO) layer 1420 in accordance with an example embodiment. In the example embodiment, the MELO layer 1420 comprising 4H—SiC overlies a 3C-SiC layer 1410 comprising polycrystalline 3C silicon carbide. As shown, MELO layer 1420 completely covers 3C-SiC layer 1410. The 3C-SiC layer 1410 does not participate in subsequent formation of any epitaxy as it is not exposed and is sealed by 4H—SiC epitaxial lateral overgrowth 1400. The 3C-SiC layer 1410 at least partially overlies mask layer 1100 in silicon carbide substrate 500. In one embodiment, merged epitaxial lateral overgrowth (MELO) layer 1420 includes epitaxial lateral overgrowth 1400 formed from side walls of plurality of pillars 900 of FIG. 13. In one embodiment, MELO layer 1420 comprises merged lateral epitaxial overgrowth regions 1300 from adjacent pillars of plurality of pillars 900 formed above 3C—SiC layer 1410. The MELO layer 1420 further includes the top surface of plurality of pillars 900. As shown, step flow growth regions 1200 are the top surface of pillars of plurality of pillars 900 extending above the epitaxial lateral overgrowth 1400 between plurality of pillars 900. By controlling the growth conditions, a high quality epitaxial layer can be grown comprising regions of high quality lateral overgrowth 1400 with step flow growth regions 1200 of FIG. 13 which may have a density of defects due to step flow growth over surface of pillars of plurality of pillars 900.

As mentioned herein above, lateral epitaxial overgrowth may be used to form a low defectivity silicon carbide epitaxial layer in the absence of mask layer 1100 between plurality of pillars 900. In this case, the 4H—SiC growth along the <1120> or <1100> directions due to the lateral epitaxial growth will merge to form a continuous epitaxial layer overlying the vertical 4H—SiC growth in spacing 920 between plurality of pillars 900 due to step flow growth. This merged epitaxial growth is possible by controlling height 910 of plurality of pillars 900 and spacings 920 between adjacent pillars in plurality of pillars 900 to form a high quality SiC epitaxial layer with low defect density. In one embodiment, the low defectivity silicon carbide epitaxial layer is formed single crystal with silicon carbide substrate 500 and is formed overlying the entire silicon carbide substrate 500 or wafer.

Figure 15:
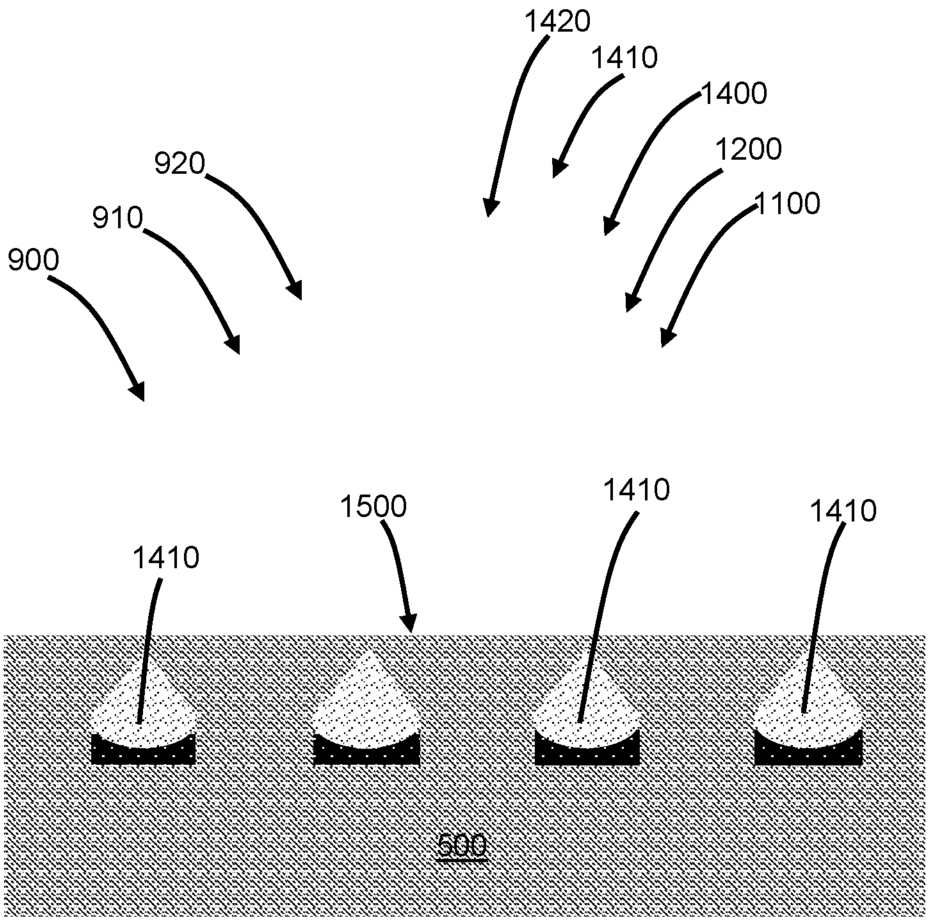
FIG. 15 is an illustration of a Silicon Carbide epitaxial layer in accordance with an example embodiment.

FIG. 15 is an illustration of a Silicon Carbide epitaxial layer 1500 in accordance with an example embodiment. The surface of merged epitaxial lateral overgrowth (MELO) layer 1420 comprises epitaxial lateral overgrowth 1400 with step flow growth regions 1200 of FIG. 13. A surface of MELO layer 1420 is lightly polished that includes exposing a top surface of pillars of plurality of pillars 900 of FIG. 9. The light polishing step is called a kiss polish that removes any surface defects on the surface of merged epitaxial lateral overgrowth (MELO) layer 1420. In one embodiment, the kiss polish is meant to remove step flow growth regions 1200 of FIG. 12 along with a thickness of region of epitaxial lateral overgrowth 1400 so as to produce a 4 degree off cut surface for subsequent epitaxial steps.

The kiss polish results in a merged epitaxial lateral overgrowth (MELO) layer 1420 comprises epitaxial lateral overgrowth 1400 of regions between adjacent pillars of plurality of pillars 900 of FIG. 9 with top surface area of plurality of pillars 900 of FIG. 14. In one embodiment, the top surface area of plurality of pillars 900 of FIG. 14 comprises small regions of silicon carbide with step flow growth over the plurality of pillar 900 of FIG. 14. The combination of epitaxial layer overgrowth 1400 and the top surface area of plurality of pillars is configured to be extremely low in defect density for growing subsequent epitaxial layers. In one embodiment, the defect density when growing subsequent epitaxial layers can be further optimized to reduce defect density. In the example embodiment, the propagation of defects can be decreased by reducing the top surface area of the pillars of plurality of pillars 900 as a proportion of the area between the adjacent pillars overlying silicon carbide substrate 500. The ratio of the top surface area of plurality of pillars 900 contributing to the density of defects can be reduced in comparison to the larger proportion of the high quality epitaxial layer contributed by the lateral epitaxial overgrowth between adjacent pillars of plurality of pillars 900.

Figure 16:
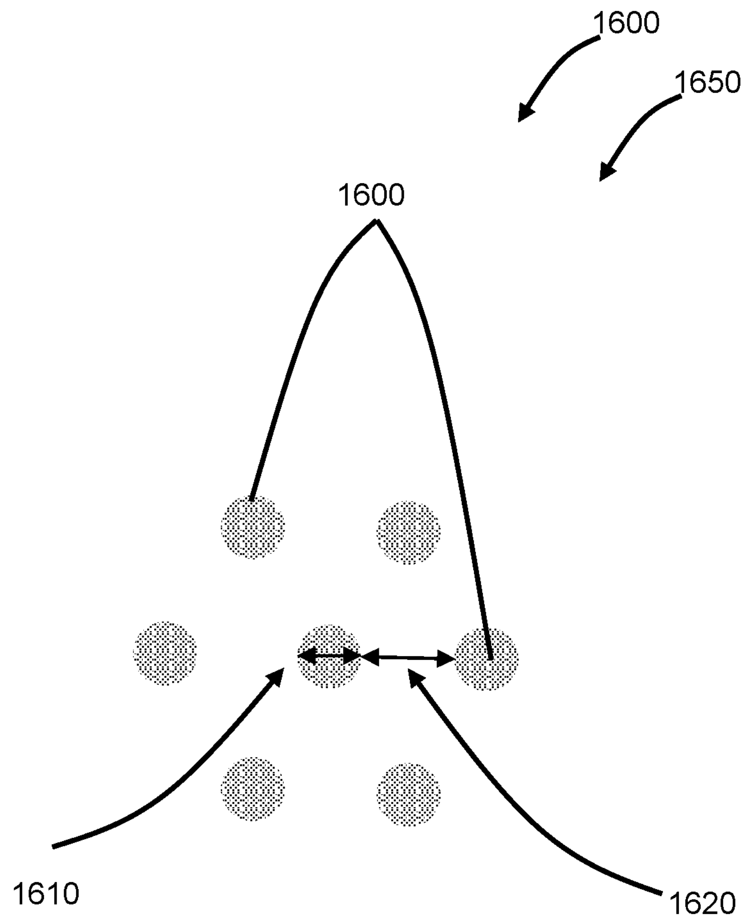
FIG. 16 is an illustration showing a plurality of pillars formed in surface of a silicon carbide substrate in accordance with an example embodiment.

FIG. 16 is an illustration showing a plurality of pillars 1600 formed in surface of a silicon carbide substrate 1650 in accordance with an example embodiment. In the example embodiment, it will be understood that plurality of pillars undergoes step flow growth when placed in an epitaxial reactor and the top view does not show a mask layer between adjacent pillars over surface of silicon carbide substrate 1650 as described earlier. In the example embodiment, plurality of pillars 1600 are shown to be round in shape although they may have different other shapes such as squares, squares with rounded corners, hexagonal, among other shapes. In the example embodiment, plurality of pillars 1600 are round with a diameter 1610. The spacing 1620 between adjacent pillars is the region where the mask layer is disposed to inhibit step flow growth from the surface of silicon carbide substrate 1650 below a top surface of each pillar of plurality of pillars 1600.

Figure 17:
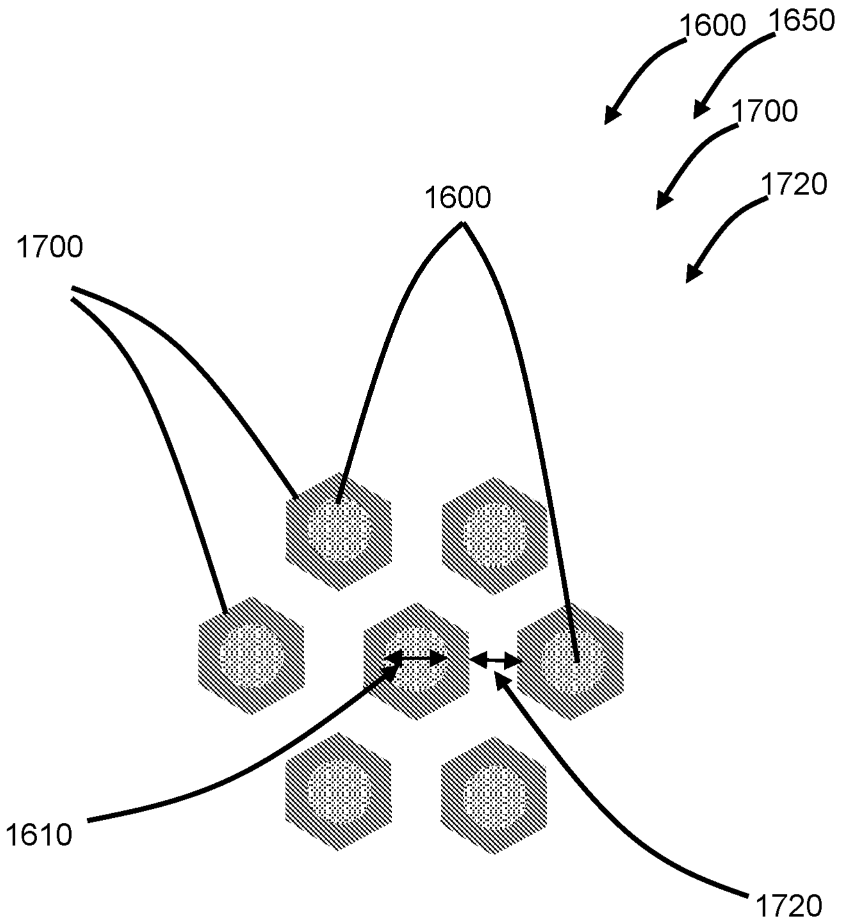
FIG. 17 is an illustration of the lateral epitaxial growth from the sidewalls of the plurality of pillars, in accordance with an example embodiment.

FIG. 17 is an illustration of the lateral epitaxial growth 1700 from the sidewalls of plurality of pillars 1600 after the conclusion of the step flow growth of the epitaxial layer in the epitaxial reactor in accordance with an example embodiment. Since there are no steps or terraces on the top surface of each pillar of plurality of pillars 1600, lateral epitaxial growth 1700 in the <1120> or <1100> direction occurs with a high quality or low defect density. The spacing 1720 shows the gap between adjacent pillars due to lateral epitaxial growth 1700 of each pillar of plurality of pillars 1600. The growth of 3C-polycrystalline silicon carbide over the mask layer between adjacent pillars of plurality of pillars 1600 as described in detail herein above is not shown in FIG. 17. In the example embodiment, lateral epitaxial overgrowth 1700 occurs from sidewalls of the plurality of pillars above the 3C-polycrystalline silicon carbide.

Figure 18:
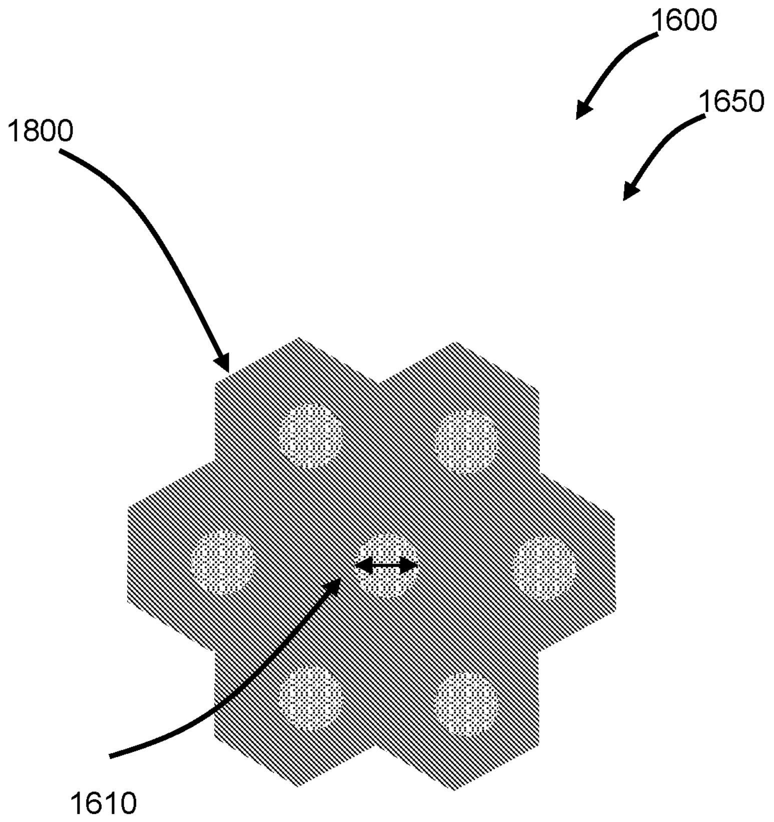
FIG. 18 is an illustration of a merged epitaxial lateral overgrowth (MELO) layer where the lateral epitaxial growth of each pillar merges at a later stage of epitaxial growth, in accordance with an example embodiment.

FIG. 18 is an illustration of a merged epitaxial lateral overgrowth (MELO) layer 1800 where lateral epitaxial growth 1700 of each pillar of plurality of pillars 1600 merges at a later stage of epitaxial growth in accordance with an example embodiment. In FIG. 18, plurality of pillars 1600 from FIG. 16 and FIG. 17 undergo lateral epitaxy of high quality with low defect density such that a continuous epitaxial layer of silicon carbide is formed. As previously mentioned, the merged epitaxial lateral overgrowth (MELO) layer is formed overlying the 3C-polycrystalline silicon carbide formed between plurality of pillars 1600 as described herein above. Since the size of plurality of pillars can be varied to ensure that the area for step flow growth on top surface of plurality of pillars 1600 is a small proportion of the final area of merged epitaxial lateral overgrowth (MELO) layer 1800, the density of structural and surface defects of silicon carbide substrate 1650 can be reduced significantly. Thus, a silicon carbide epitaxial layer can be grown on surface of silicon carbide substrate 1650 with high quality (low defect density). Moreover, the defectivity can be controlled by optimizing the ratio of top surface area of plurality of pillars 1600 to an area of MELO layer 1800.

Figure 19:
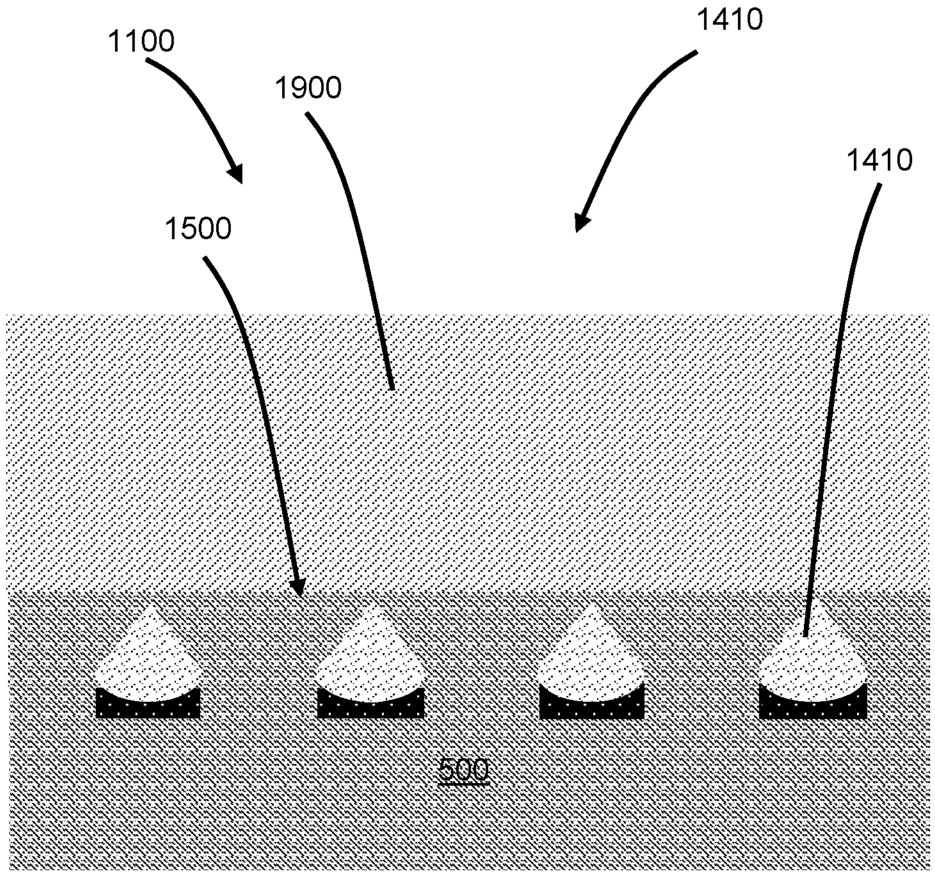
FIG. 19 is an illustration of a second silicon carbide epitaxial layer formed overlying the silicon carbide epitaxial layer, in accordance with an example embodiment.

FIG. 19 is an illustration of a silicon carbide epitaxial layer 1900 formed overlying a silicon carbide epitaxial layer 1500 as shown in FIG. 15 in accordance with an example embodiment. In one embodiment, a device is formed in silicon carbide epitaxial layer 1900 that is grown overlying silicon carbide epitaxial layer 1500 in an epitaxial reactor. In one embodiment, silicon carbide epitaxial layer 1900 is formed using a standard epitaxial process for growing a vertical epitaxial layer having the same crystal orientation as silicon carbide epitaxial layer 1500. Silicon carbide epitaxial layer 1900 may be termed as device epitaxial layer since a silicon carbide device is formed in this layer as described in subsequent processing steps.

In one embodiment, the doping and thickness of silicon carbide epitaxial layer 1900 are determined by the electrical requirements of devices that are formed. In one embodiment, the thickness of silicon carbide epitaxial layer 1900 is determined by a breakdown voltage of the device formed in the silicon carbide epitaxial layer 1900 in subsequent processing steps and is typically between (5-100) micrometers. In the example embodiment, silicon carbide epitaxial layer 1900 is doped N- and has a thickness of about 10-12 micrometers for a device breakdown voltage of 1200 Volts. Silicon carbide epitaxial layer 1900 formed overlying silicon carbide epitaxial layer 1500 is used for formation of silicon carbide devices using processes well known to those skilled in the art. In the example embodiment, silicon carbide epitaxial layer 1900 is used for formation of a Schottky Barrier Diode in accordance with the current invention.

Figure 20:
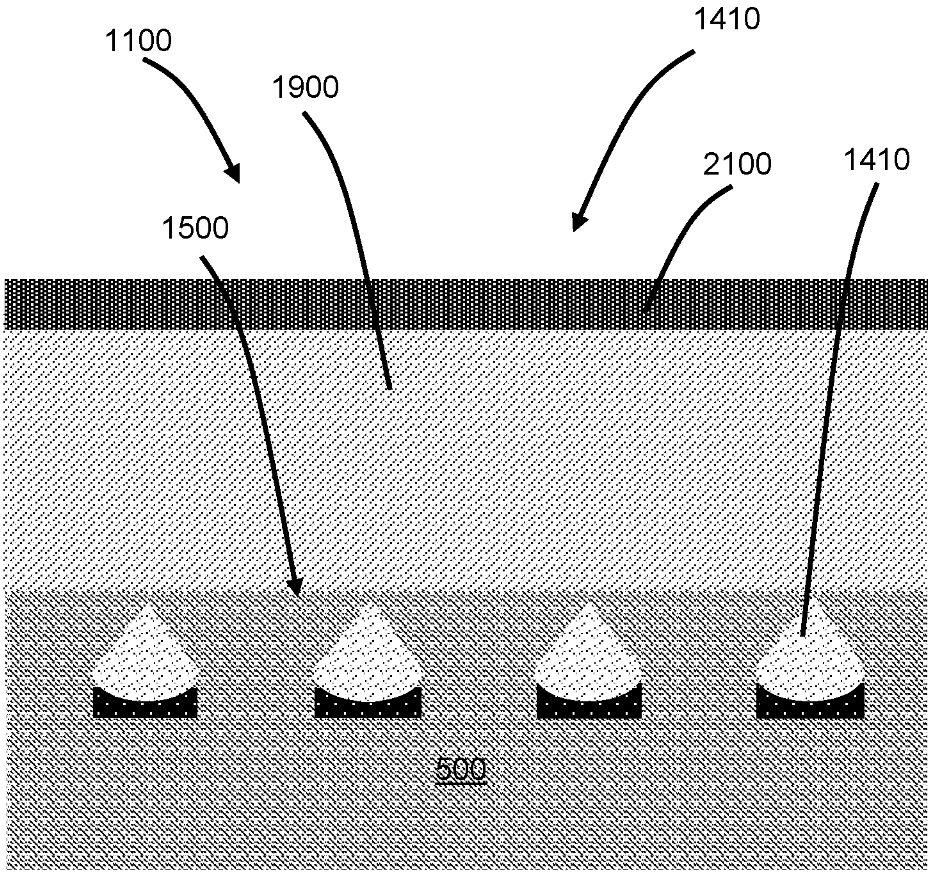
FIG. 20 is an illustration of a dielectric isolation layer deposited in accordance with an example embodiment.

FIG. 20 is an illustration of a dielectric isolation layer 2100 deposited in accordance with an example embodiment. Dielectric isolation layer 2100 is deposited by using PECVD Silicon Dioxide, PECVD Silicon Nitride, PECVD, or Silicon Oxynitride among other films. In one embodiment, a thickness of dielectric isolation layer 2100 is in a range of (1-4) micrometers. In the example embodiment, dielectric isolation layer 2100 is PECVD Silicon Oxide and is approximately one micrometer thick.

Figure 21:
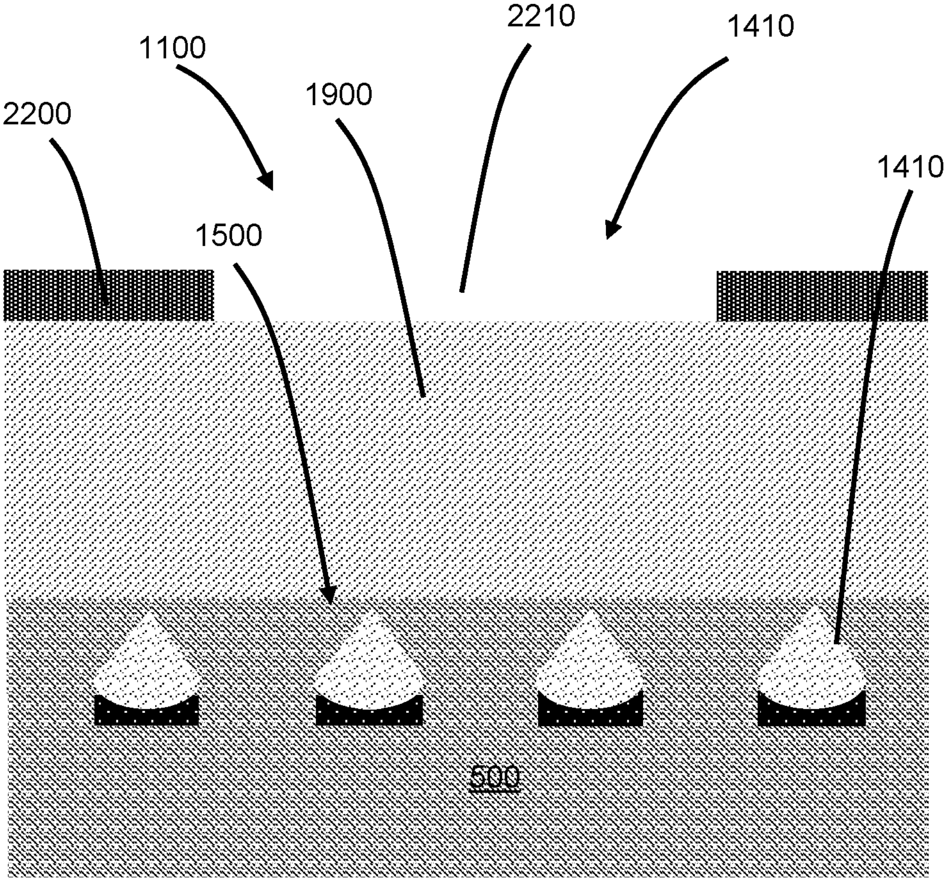
FIG. 21 is an illustration of contact openings by patterning the dielectric isolation layer to form a patterned dielectric isolation layer, in accordance with an example embodiment.

FIG. 21 is an illustration of contact openings 2210 by patterning dielectric isolation layer 2110 to form patterned dielectric isolation layer 2200 in accordance with an example embodiment. In the example embodiment, contact openings 2210 are formed in dielectric isolation layer 2100 to generate patterned dielectric isolation layer 2200. In one embodiment, dielectric isolation layer 2100 is patterned to protect areas of dielectric isolation layer 2100 from etching. Exposed areas are then etched to form contact openings 2210. The remaining dielectric isolation layer is patterned dielectric isolation layer 2200. In one embodiment, patterning is done using photolithography techniques and etching of the dielectric isolation layer to form contact openings 2210 using RIE (Reactive Ion Etching), wet etching or a combination of etching steps. In the example embodiment, contact openings 2210 are patterned using RIE.

Figure 22:
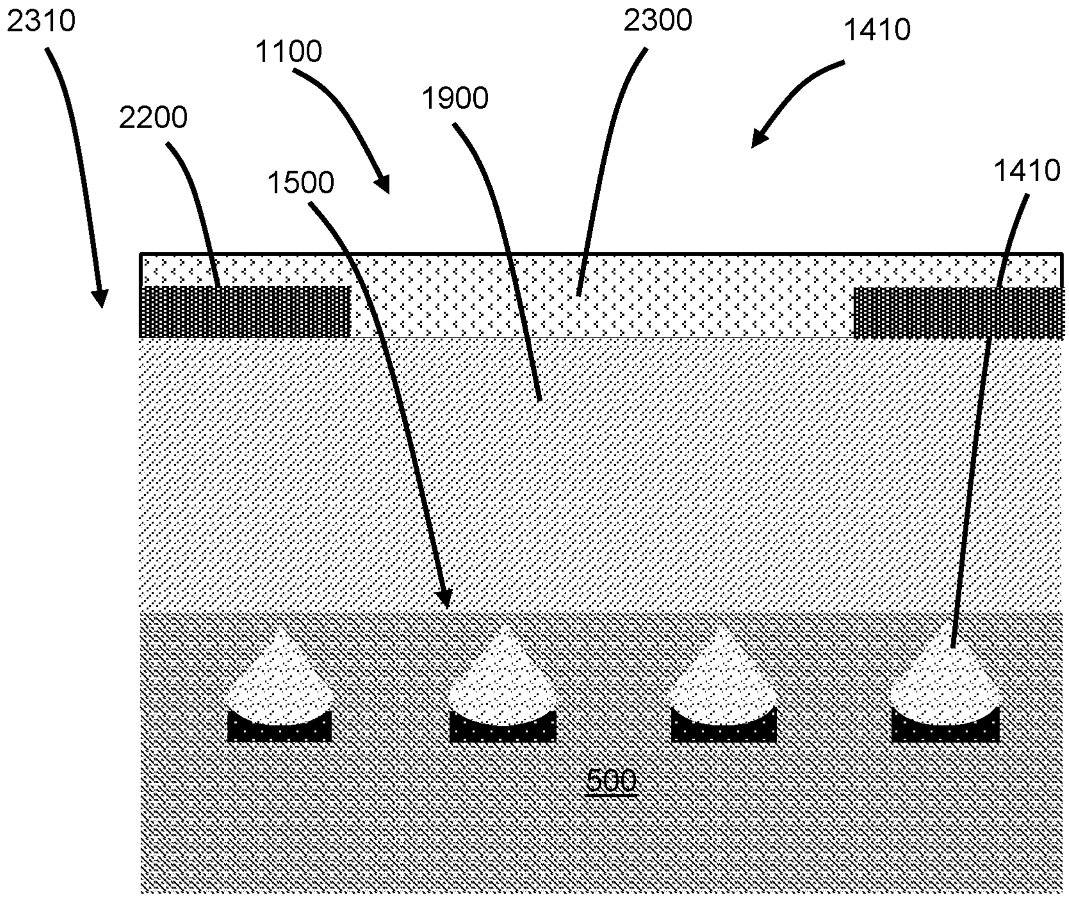
FIG. 22 is an illustration of a metal contact layer configured to form an electrode of a Schottky Barrier Diode in accordance with an example embodiment.

FIG. 22 is an illustration of a metal contact layer 2300 configured to form an electrode of the Schottky Diode in accordance with an example embodiment. In one embodiment, contact openings 2210 of FIG. 21 are covered with metal contact layer 2300. Metal contact layer 2300 is deposited using sputtering, e-beam evaporation, electrodeposition among other techniques and can also use a combination of metal deposition techniques. Metal contact layer 2300 may be patterned using lithography and etched. In addition, lift-off techniques may also be used for the deposition and patterning of metal contact layer 2300, as will be evident to those skilled in the art. Metal contact layer 2300 may be annealed or sintered to ensure good Schottky contact with ohmic contact region 2100. After formation of metal contact layer 2300, a passivation layer may be deposited and patterned to expose bond pads of the example device in accordance with the current invention. At this stage of the example embodiment, the fabrication of a semiconductor device such as the Schottky Barrier Diode is complete in silicon carbide epitaxial layer 1900 formed over silicon carbide epitaxial layer 1500 which overlies mask layer 1100 in silicon carbide substrate 500. In an example embodiment, front side metallization results in formation of a semiconductor device such as a Schottky Barrier Diode 2310 in silicon carbide epitaxial layer 1900 and silicon carbide epitaxial layer 1500. While the example embodiment described the formation of a semiconductor device such as Schottky Barrier Diode 2310, other semiconductor devices may be formed in silicon carbide epitaxial layer 1900 overlying silicon carbide epitaxial layer 1500. It should be noted that in the example embodiment, substrate 500 is not a component of Schottky Barrier Diode 2310 and can be removed without affecting performance or reliability of the device.

Figure 23:
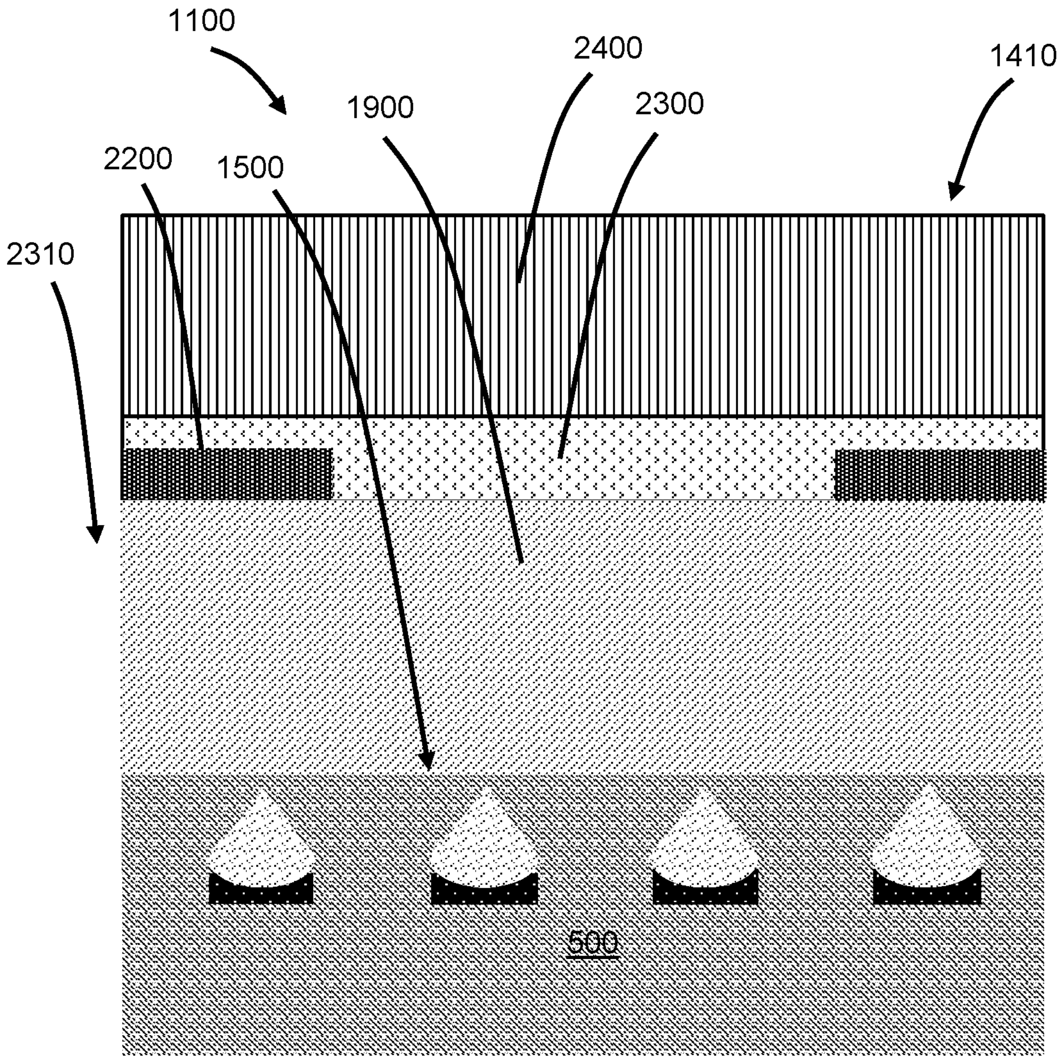
FIG. 23 is an illustration of a handle wafer temporarily coupled to the silicon carbide substrate with the Schottky Barrier Diode, in accordance with an example embodiment.

FIG. 23 is an illustration of a handle wafer 2400 temporarily coupled to silicon carbide substrate 500 with Schottky Barrier Diode 2310 in accordance with an example embodiment. Silicon carbide substrate 500 with Schottky Barrier Diode 2310 is temporarily coupled to handle wafer 2400 to enable an exfoliation process which is subsequently described. The exfoliation process enables the separation of a portion of silicon carbide substrate 500 with Schottky Barrier Diode 2310 to be separated from the major portion of silicon carbide substrate 500.

In one embodiment, silicon carbide substrate 500 with Schottky Barrier Diode 2310 is attached to handle wafer 2400 by adhesives such as UV sensitive glue among others. Handle wafer 2400 may be borosilicate glass which is UV transparent and may be used with a UV curable adhesive for the bonding.

The exfoliation process occurs at an exfoliation layer comprising plurality of pillars 900 from FIG. 9 and mask layer 1100 of FIG. 11. Mask layer 1100 is between plurality of pillars 900 of FIG. 9 in silicon carbide substrate 500. Schottky Barrier Diode 2310 is formed in silicon carbide epitaxial layer 1900 overlying silicon carbide epitaxial layer 1500. In one embodiment, a plane of the exfoliation layer is substantially parallel to the surface of silicon carbide substrate 500 but below the surface of silicon carbide substrate 500. In the example embodiment, the plane of exfoliation will occur at approximately mask layer 1100 of FIG. 11.

Different methods of exfoliation may be used to separate a portion of silicon carbide substrate 500 with Schottky Barrier Diode 2310 from a major portion of silicon carbide substrate 500. In an example embodiment, a laser may be used for the exfoliation. In the example embodiment, a laser that is substantially transparent to Silicon Carbide is focused from the backside on the exfoliation layer through silicon carbide substrate 500. As previously mentioned, the exfoliation layer comprises plurality of pillars 900 from FIG. 9 and mask layer 1100 between plurality of pillars 900 of FIG. 9 in silicon carbide substrate 500. In the example embodiment, mask layer 1100 comprises carbon. The energy from the laser is selectively coupled to mask layer 1100 comprising carbon between plurality of pillars 900 in silicon carbide substrate 500. In one embodiment, the laser rapidly heats the carbon of mask layer 1100 thereby producing a thermal shock that fractures pillars adjacent to the heated carbon of plurality of pillars 900 of FIG. 9 in silicon carbide substrate 500. The fracture in plurality of pillars 900 of FIG. 9 due to thermal shock causes a portion of silicon carbide substrate 500 with Schottky Barrier Diode 2310 to be exfoliated the major portion of silicon carbide substrate 500. In the example embodiment, A combination Schottky Barrier Diode 2310, silicon carbide epitaxial layer 1900, silicon carbide epitaxial layer 1500, and the portion of silicon carbide substrate 500 above mask layer 1100 of FIG. 11 will remain with handle wafer 2400 after the exfoliation process. Thus, the major portion of silicon carbide substrate 500 is physically separated from Schottky Barrier Diode 2310.

Figure 24:
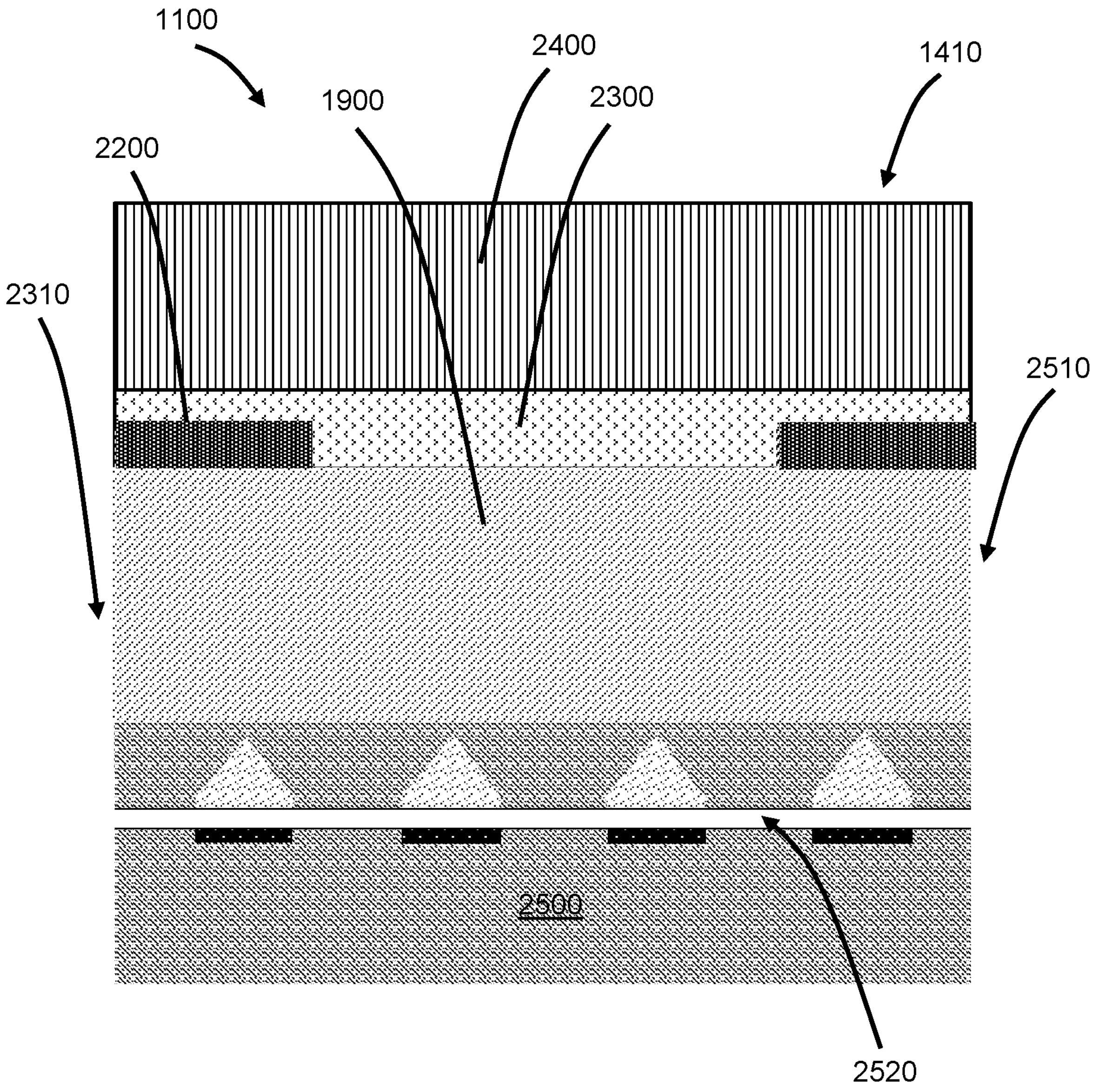
FIG. 24 is an illustration of a portion of silicon carbide substrate after exfoliation in accordance with an example embodiment.

FIG. 24 is an illustration of a portion of silicon carbide substrate 2510 after the exfoliation process is completed in accordance with an example embodiment. In the example embodiment, the separation of silicon carbide substrate 2510 using a laser causes a fracture plane 2520 leaving Schottky Barrier Diode 2310 and the portion of silicon carbide substrate 500 with handle wafer 2400 and the major portion of silicon carbide substrate 500 separated below fracture plane 2520. In the example embodiment, silicon carbide substrate 2510 comprises Schottky Barrier Diode 2310 formed in silicon carbide epitaxial layer 1900 overlying silicon carbide epitaxial layer 1500. Thus, silicon carbide substrate 2510 comprises primarily silicon carbide epitaxial layers grown in an epitaxial reactor. Silicon carbide substrate 2510 is temporarily coupled to handle wafer 2400 for the exfoliation process. Silicon carbide substrate 2500 comprises the major portion of silicon carbide substrate 500. Silicon carbide substrate 2500 is then subsequently processed for re-use for formation of semiconductor devices two or more times.

In general, fracture plane 2520 is substantially in the same plane where mask layer 1100 of FIG. 11 is formed between plurality of pillars 900 from FIG. 9 and is substantially planar to the surface of silicon carbide substrate 500 of FIG. 5. FIG. 24 is not drawn to scale since thickness of remaining silicon carbide substrate 2500 is in the range of 300-400 micrometers, while the portion of silicon carbide substrate 2510 is in the range of 20-60 micrometers. In one embodiment, the laser may be used for the exfoliation by focusing the laser energy from the front side of silicon carbide substrate 500 after formation of silicon carbide epitaxial layer 1900 before the formation of semiconductor devices using silicon carbide substrate 500 with silicon carbide epitaxial layer 1500 and silicon carbide epitaxial layer 1900. The laser energy may be used to fracture plurality of pillars 900 along a fracture plane while ensuring the periphery of silicon carbide substrate 500 is continuous without any pillars to provide mechanical integrity to silicon carbide substrate 500 during the subsequent processing steps for the formation of semiconductor devices.

Figure 25:
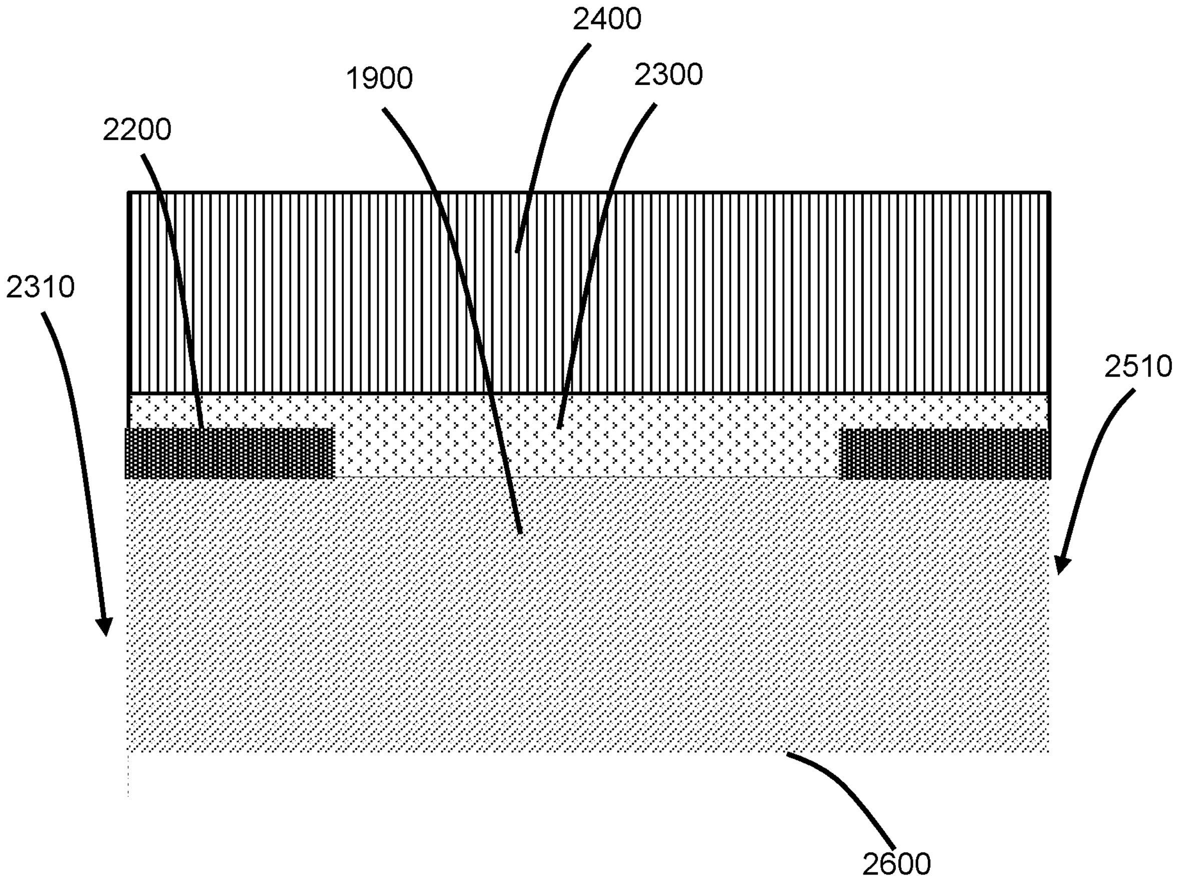
FIG. 25 is an illustration of the silicon carbide substrate comprising Schottky Barrier Diode formed in the second silicon carbide epitaxial layer overlying the silicon carbide epitaxial layer after polishing in accordance with an example embodiment.

FIG. 25 is an illustration of silicon carbide substrate 2510 comprising Schottky Barrier Diode 2310 formed in silicon carbide epitaxial layer 1900 overlying silicon carbide epitaxial layer 1500 after polishing in accordance with an example embodiment.

Silicon carbide substrate 2510 comprising Schottky Barrier Diode 2310 formed in silicon carbide epitaxial layer 1900 overlying silicon carbide epitaxial layer 1500 is polished to remove, the portion of silicon carbide substrate of FIG. 23 including remnants of mask layer 1100 from FIG. 11 and a portion of merged epitaxial lateral overgrowth layer 1800 of FIG. 18 to expose a surface 2600 of silicon carbide epitaxial layer 1900 of FIG. 19. In one embodiment, a combination of fine grind and polishing may be used to expose surface 2600 of silicon carbide epitaxial layer 1900. It should be noted that the grind and polishing is carried out on an assembly comprising silicon carbide substrate 2510 temporarily coupled to handle wafer 2400. In the example embodiment, a silicon carbide substrate of a predetermined thickness can be formed using the process disclosed herein above to improve thermal transfer and lower resistance of a silicon carbide device while lowering manufacturing cost. Thus, in one embodiment, after polishing silicon carbide substrate 2510, silicon carbide substrate 2510 consists of silicon carbide epitaxial layer 1900.

Figure 26:
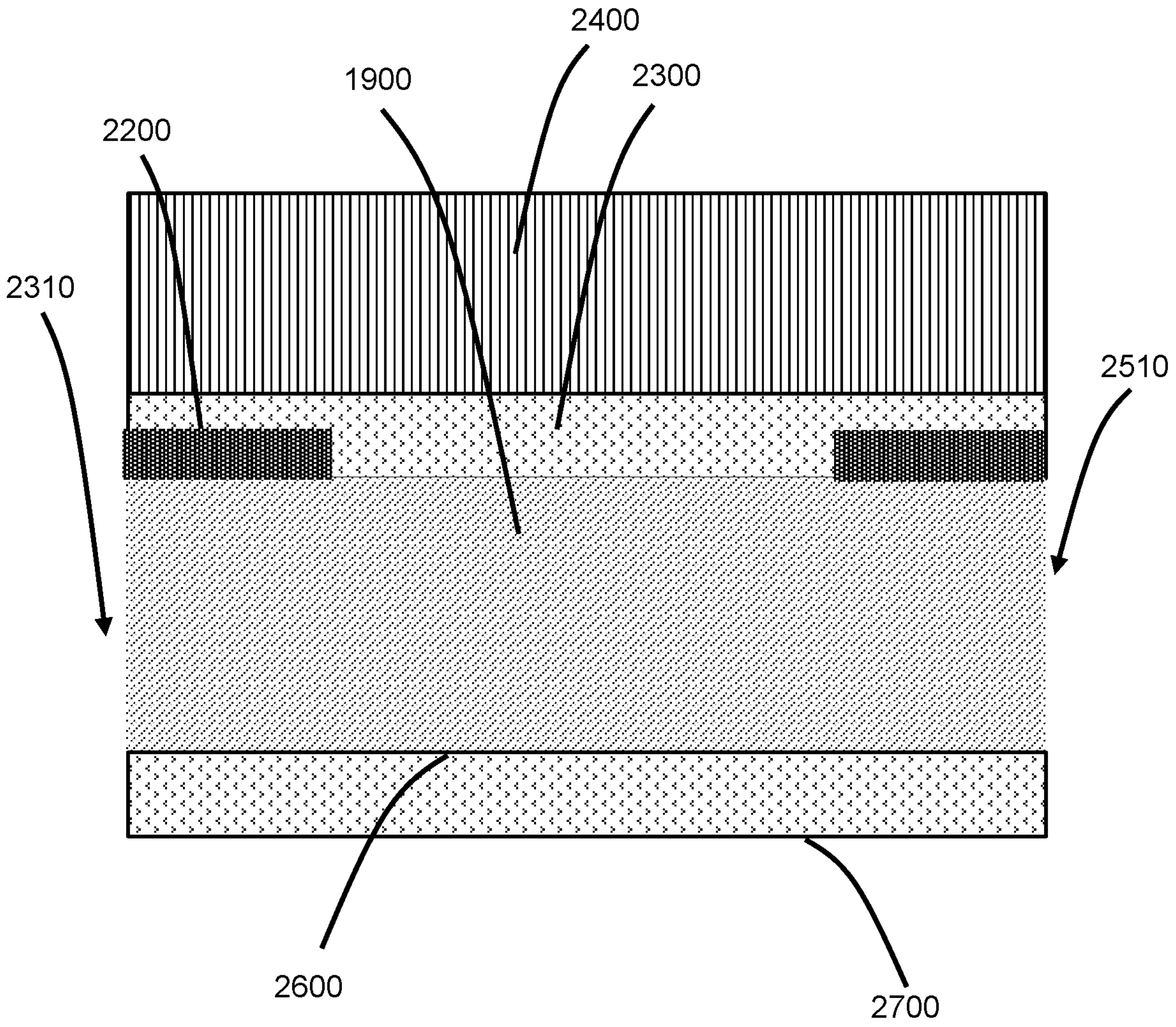
FIG. 26 is an illustration of a back metal layer deposited on a surface of a silicon carbide epitaxial layer, in accordance with an example embodiment.

FIG. 26 is an illustration of a back metal layer 2700 deposited on surface 2600 of silicon carbide epitaxial layer 1900 in accordance with an example embodiment. An exposed surface 2600 of silicon carbide substrate 2510 after polishing is coated with a metal layer to form a backside contact of Schottky Barrier Diode 2310. Back metal layer 2700 is deposited on surface 2600 using evaporation, sputtering and other methods of metal deposition. Metals such as nickel, or combination of metals such as Ti/Ni/Au (Titanium/Nickel/Gold) may be used along with annealing to reduce contact resistance to surface of silicon carbide epitaxial layer 1900. In one embodiment, laser annealing may be used to reduce contact resistance of back metal layer 2700.

Figure 27:
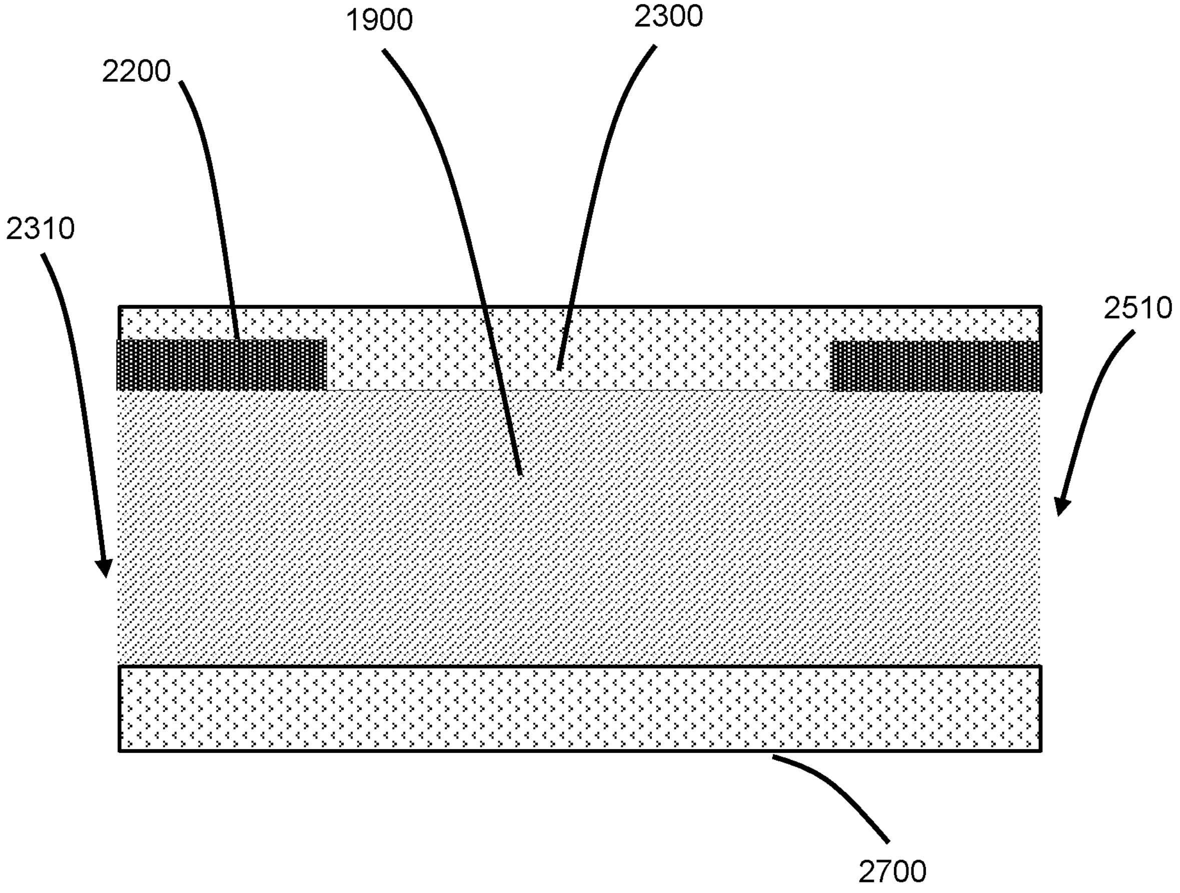
FIG. 27 is an illustration of the silicon carbide substrate with Schottky Barrier Diode after being separated from the handle wafer, in accordance with an example embodiment.

FIG. 27 is an illustration of silicon carbide substrate 2510 with Schottky Barrier Diode 2310 after being separated from handle wafer 2400 in accordance with an example embodiment. It should be noted that although a single Schottky Barrier Diode 2310 is shown fabricated on silicon carbide substrate 2510 in the example embodiment, other Schottky Barrier Diodes will be formed simultaneously on silicon carbide substrate 2510. Typically, silicon carbide substrate 2510 has sufficient area capable to form hundreds or thousands of devices depending on substrate size. In one embodiment, after back metal layer 2700 is deposited, the entire assembly comprising of silicon carbide substrate 2510 and handle wafer 2400 is attached to a blue dicing tape. Handle wafer 2400 is then separated from silicon carbide substrate 2510 which is attached to the dicing tape. In the example embodiment, silicon carbide substrate 2510 having multiple Schottky Barrier Diodes 2310 is diced and assembled in packages.

Figure 28:
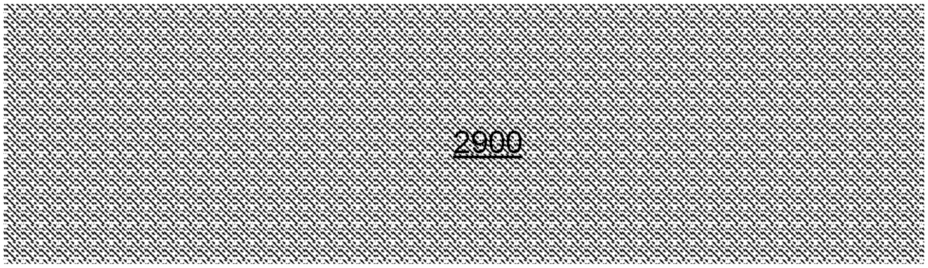
FIG. 28 is an illustration of a reclaimed silicon carbide substrate after performing the exfoliation process in accordance with an example embodiment.

FIG. 28 is an illustration of a reclaimed silicon carbide substrate 2800 after performing the exfoliation process in accordance with an example embodiment. After the exfoliation process that separates silicon carbide substrate 2510 from silicon carbide substrate 2500 of FIG. 24 is further processed to make silicon carbide substrate 2500 suitable for reuse.

As previously disclosed herein above, silicon carbide substrate 2500 of FIG. 24 is the major portion of silicon carbide substrate 500 from FIG. 5. Silicon carbide substrate 2500 of FIG. 24 is reclaimed by re-polishing a surface exposed to fracture plane 2520 from FIG. 24 such that a polished surface is suitable for formation of semiconductor devices using the current invention. In one embodiment, the polishing of the surface of silicon carbide substrate 2500 of FIG. 24 to form reclaimed silicon carbide substrate 2900 is performed using CMP (chemical mechanical polishing), electrochemical polishing among other methods. Reclaimed silicon carbide substrate 2900 can be used for successive formation of semiconductor devices using the same silicon carbide substrate 500 of FIG. 5 but with a portion removed by each subsequent exfoliation process.

By the successive application of the current invention as described by the example embodiment, the same original silicon carbide substrate 500 of FIG. 5 can be used for fabrication of silicon carbide semiconductor devices multiple times leading to significant reduction in the cost of fabrication of silicon carbide semiconductor devices. By application of the method of exfoliation, silicon carbide devices can be fabricated with lower $RDS_{on}$ leading to higher electrical efficiency and lower thermal resistance.

Figure 29:
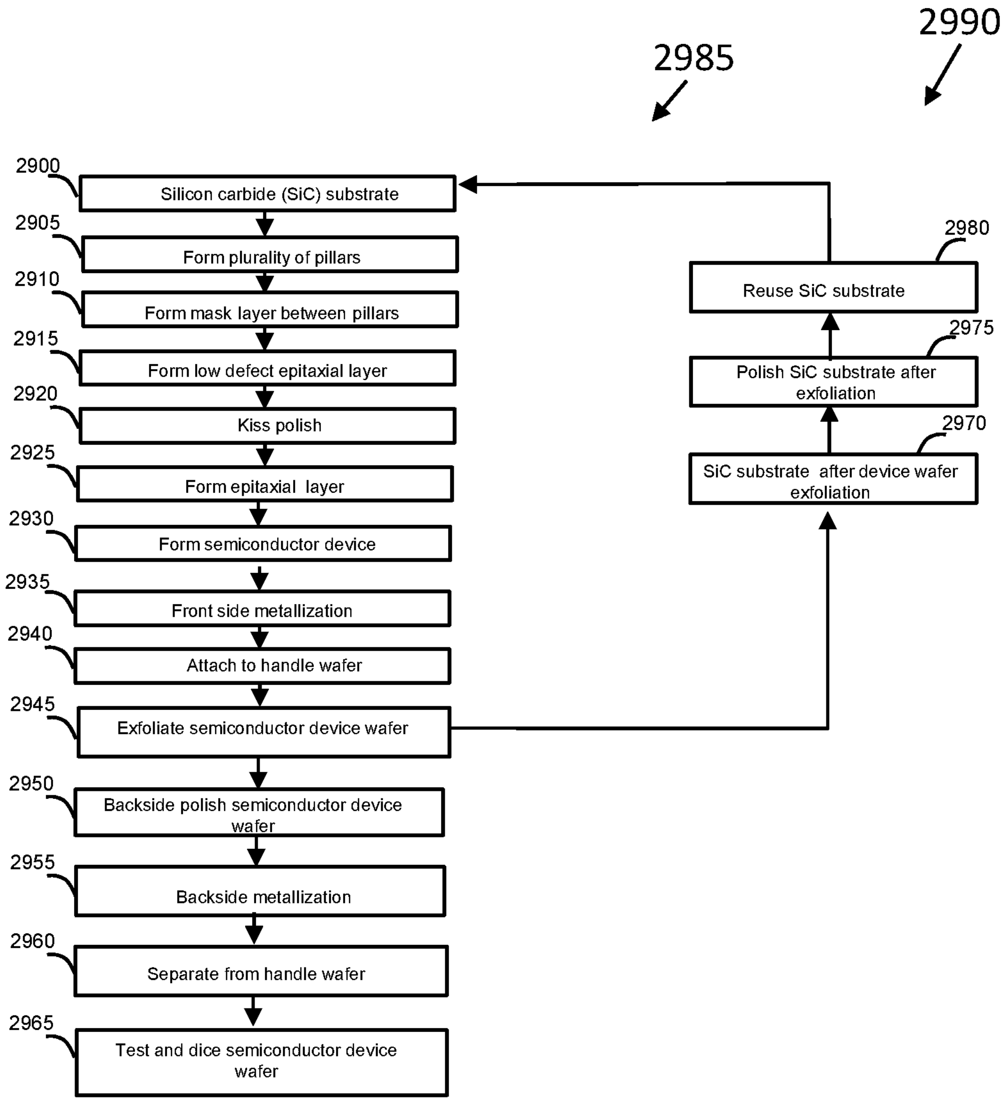
FIG. 29 is an illustration of a block diagram of the formation of a semiconductor device such as a Schottky Barrier Diode using an exfoliation process in accordance with an example embodiment.

FIG. 29 is an illustration of a block diagram 2990 of the formation of a semiconductor device such as a Schottky Barrier Diode using an exfoliation process 2985 in accordance with an example embodiment. Substrate forming process and exfoliation process 2985 supports reuse of silicon carbide substrate 500 of FIG. 5 in the manufacture of semiconductor devices. The order of the blocks in block diagram in FIG. 29 is for illustrative purposes only and does not imply an order or show all the specific steps in the implementation of the invention as are known by one skilled in the art.

In one embodiment, blocks 2900, 2905, 2910, 2915, 2920, 2925, 2930, 2935, 2940, 2945, 2950, 2955, 2960, 2965, 2970, 2975, and 2980 comprises the formation of a substrate and exfoliation process 2985 to separate the substrate from the silicon carbide substrate. In the example, the substrate comprises at least a first silicon carbide epitaxial layer and a second silicon carbide epitaxial layer and semiconductor devices are formed in the substrate.

In block diagram 2990, block 2900 illustrates the silicon carbide substrate used to form the substrate in an example embodiment. In block 2905, a plurality of pillars are formed in silicon carbide substrate and a mask layer is formed between the plurality of pillars as shown in block 2910. Block 2915 shows the formation of a low defect epitaxial layer of silicon carbide grown by a combination of step flow growth and merged epitaxial lateral overgrowth to form a low defect epitaxial layer comprising silicon carbide as described in detail earlier. Block 2920 shows the kiss polish performed on the surface of the low defect silicon carbide epitaxial layer to remove the surface roughness. Block 2925 shows the epitaxial layer grown above the surface of the low defect silicon carbide epitaxial layer after the kiss polish and used to form at least a semiconductor device as shown in block 2930. In the example embodiment, the semiconductor device is a plurality of Schottky Barrier Diodes. The epitaxial layer shown in block 2925 may comprise one or more silicon carbide epitaxial layers required to form the semiconductor devices.

Block 2935 shows the front side metallization of the semiconductor devices. Block 2940 shows the step of attaching the completed semiconductor device wafer with front side metallization to a handle wafer. The assembly of completed semiconductor device layer and handle wafer is then subjected to the exfoliation process to produce semiconductor device wafer as shown in block 2945.

Block 2950 shows the backside polish of the semiconductor device wafer before the backside metallization to form the backside metal contact of the Schottky Barrier Diodes as shown in block 2955. Block 2960 shows the separation of the semiconductor device wafer with the Schottky Barrier Diode separated from the handle wafer and then tested and diced into individual semiconductor devices as shown in block 2965.

Block 2970 shows the remaining portion of the silicon carbide substrate after exfoliation which is then polished to remove any remnants of the mask layer and plurality of pillars, as shown in block 2975. Block 2980 shows the reclaimed substrate after the polish and reused multiple times to form a semiconductor device, in accordance with the current invention.

As mentioned herein above, only a fraction of the silicon carbide substrate is used in the formation of the substrate. A remaining portion of the silicon carbide substrate can be reused to form more substrates and more devices, thus extending the life of the silicon carbide substrate and forming the devices on the substrate of a controlled and predetermined thickness.

Figure 30:
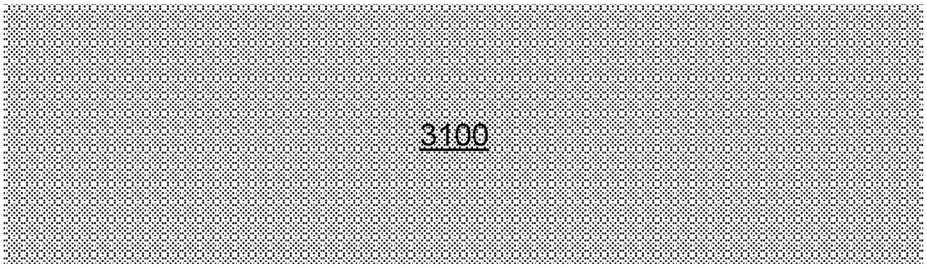
FIG. 30 is an illustration of a silicon carbide substrate used to illustrate an alternate embodiment of the current invention.

FIG. 30 is an illustration of a silicon carbide substrate 3100 in accordance with an example embodiment. In the example embodiment, silicon carbide substrate 3100 is offcut to 4 degrees to the <0001> axis in order to facilitate growth of a subsequently grown silicon carbide epitaxial layer.

Figure 31:
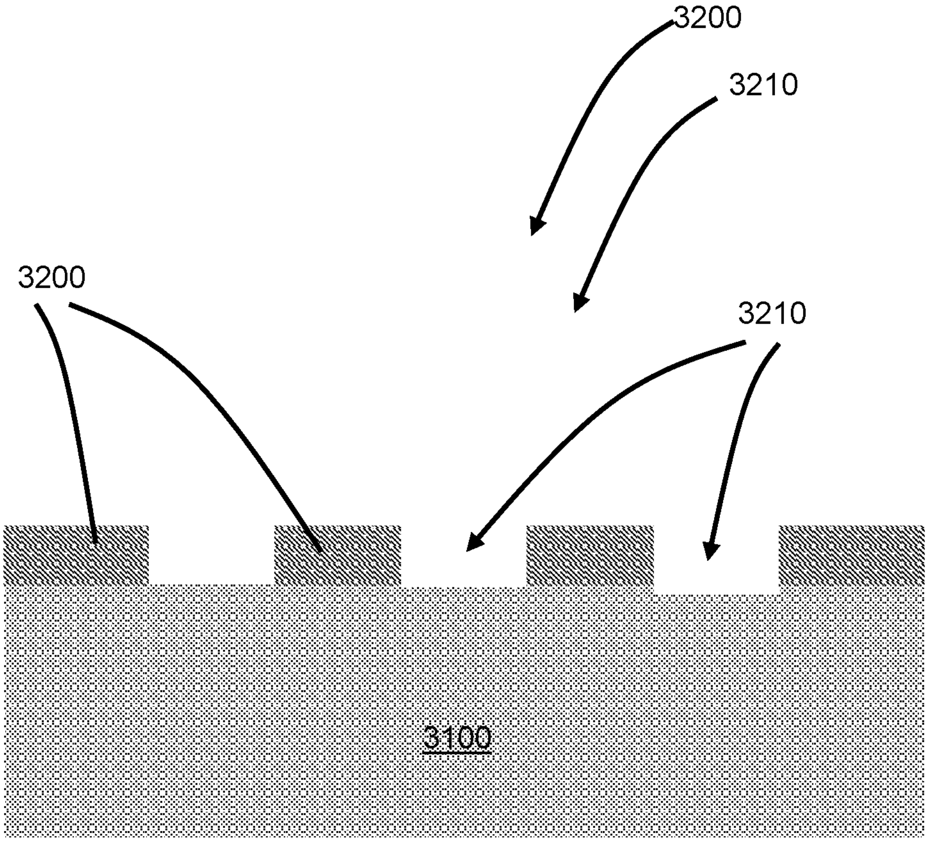
FIG. 31 is an illustration of a hard mask deposited and patterned on the surface of the silicon carbide substrate, in accordance with an example embodiment.

FIG. 31 is an illustration of a hard mask deposited and patterned on a surface of silicon carbide substrate 3100 in accordance with an example embodiment. The hard mask that is used may be deposited using PECVD, LPCVD, SACVD among other methods of deposition and may comprise of materials such as silicon oxide, silicon nitride, silicon oxynitride, and may be deposited in one or more layers. The thickness of the hard mask may be in the range of (0.5-3.0) micrometers and is determined by the subsequent processing steps. In the example embodiment, the hard mask layer used is PECVD deposited silicon oxide. The hard mask layer is then patterned using lithography and etched to form patterned hard mask 3200 and openings 3210 to expose regions of surface of silicon carbide substrate 3100. The size of patterned hard mask 3200 may be in the range of (0.25-3.0) micrometers and the size of openings 3210 may be in the range of (0.25-5.0) micrometers.

Figure 32:
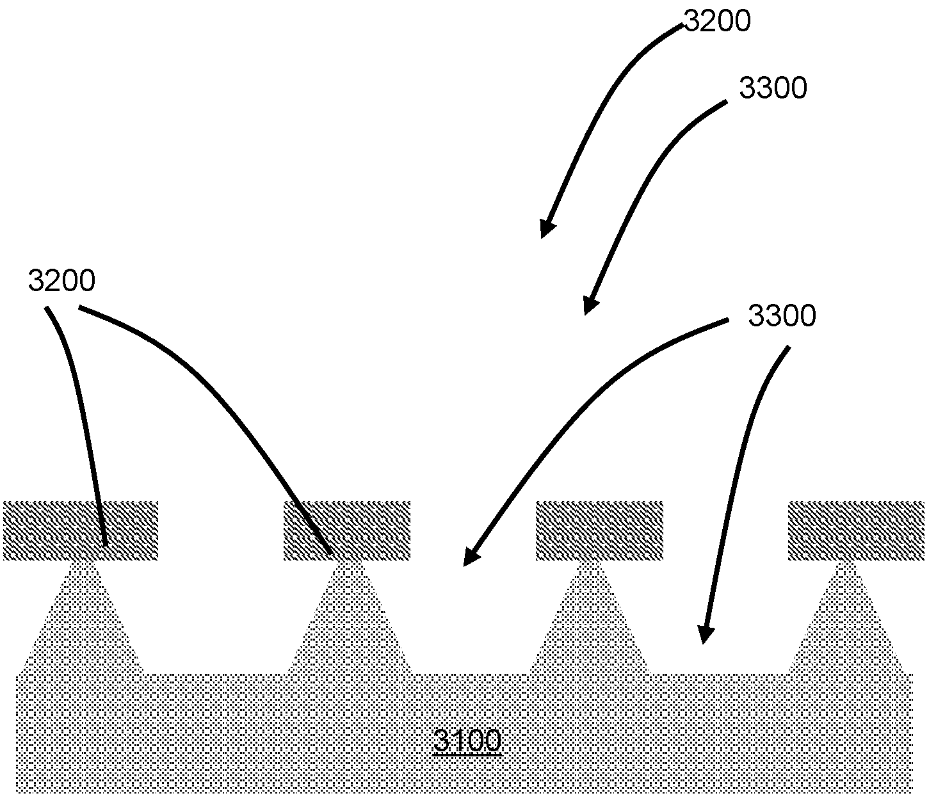
FIG. 32 is an illustration of opening formed in the exposed regions of the silicon carbide substrate in accordance with an example embodiment.

FIG. 32 is an illustration of openings 3300 formed in exposed regions of silicon carbide substrate 3100 in accordance with an example embodiment. Openings 3300 are formed in silicon carbide substrate 3100 by etching the exposed regions of silicon carbide substrate 3100. Openings 3300 are formed with sloped sidewalls such that they are narrower at the bottom of openings 3300 and wider at the top of openings 3300 with a flat surface at the bottom of each opening 3300. Openings 3300 may be etched using wet etching chemistries such as molten KOH or by dry etching methods such as RIE. In the example embodiment, dry etching technique using RIE is used to form the sloping walls of openings 3300 by undercutting below patterned hard mask 3200. The erosion of patterned hard mask 3200 and varying the etch parameters such as gas flow, pressure, ratios and power in the RIE are used to form the sloping walls of openings 3300.

Figure 33:
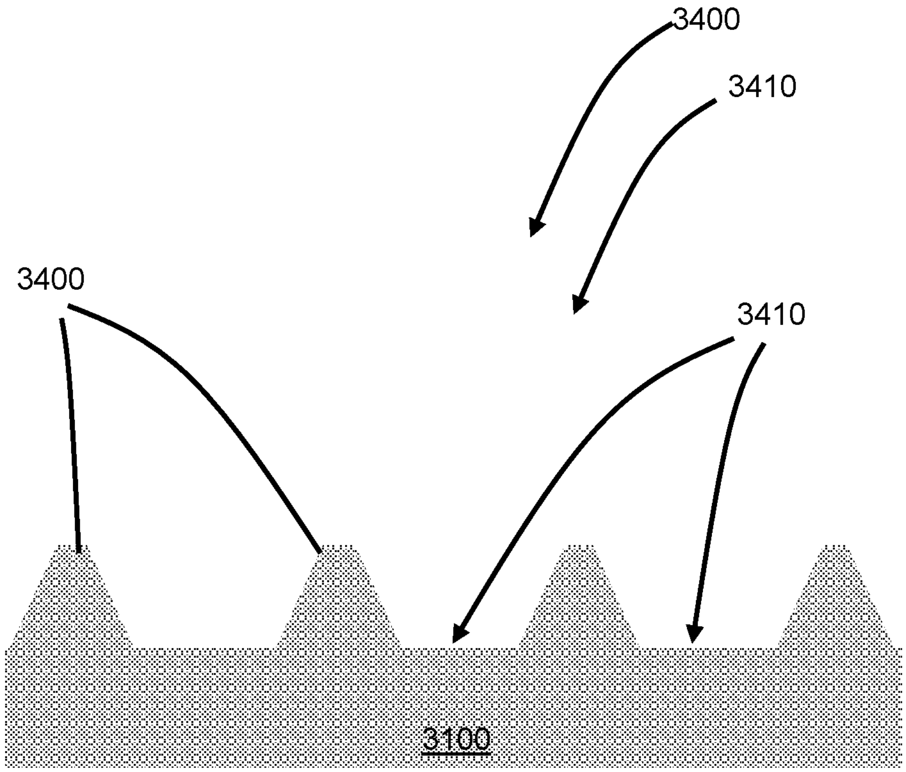
FIG. 33 is an illustration of the formation of a plurality of pillars in the silicon carbide substrate after removal of the patterned hard mask, in accordance with an example embodiment.

FIG. 33 is an illustration of the formation of a plurality of pillars 3400 in silicon carbide substrate 3100 after removal of patterned hard mask 3200 of FIG. 32 in accordance with an example embodiment. After the removal of patterned hard mask 3200 of FIG. 32, plurality of pillars 3400 in the shape of truncated pyramids are formed with sloped sidewalls. The slopes of the sidewalls may be between (15-45) degrees from the vertical and the adjacent pyramids are separated from each other by a spacing 3410. The areas of the tops of plurality of pillars comprising truncated pyramids are much smaller than the base region and the area ratio between the top and bottom of the truncated pyramids may be in the range of (1-10)%. Spacings 3410 between the bases of adjacent pillars of plurality of pillars comprising truncated pyramids may be in the range of (0.25-5.0) micrometers.

Figure 34:
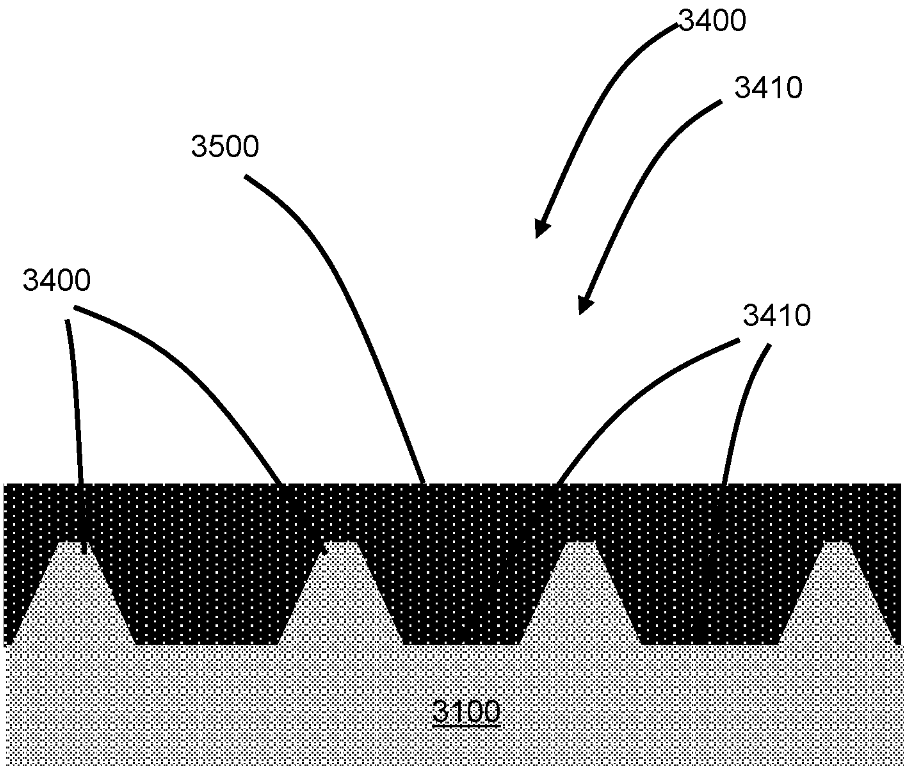
FIG. 34 is an illustration of a refill layer formed over the plurality of pillars in accordance with an example embodiment.

FIG. 34 is an illustration of a refill layer 3500 formed over plurality of pillars 3400 in accordance with the example embodiment. In one embodiment refill layer 3500 is a carbon layer. In another embodiment, refill layer 3500 is a polymer layer that is deposited and then subsequently converted into a carbon layer. In another embodiment, refill layer 3500 is a tantalum carbide layer. In general, refill layer 3500 is a layer that can be subsequently specifically targeted after further wafer processing is performed to support an exfoliation process. For example, refill layer 3500 can be selectively heated by laser in a subsequent step which will be described in further detail herein below.

Figure 35:
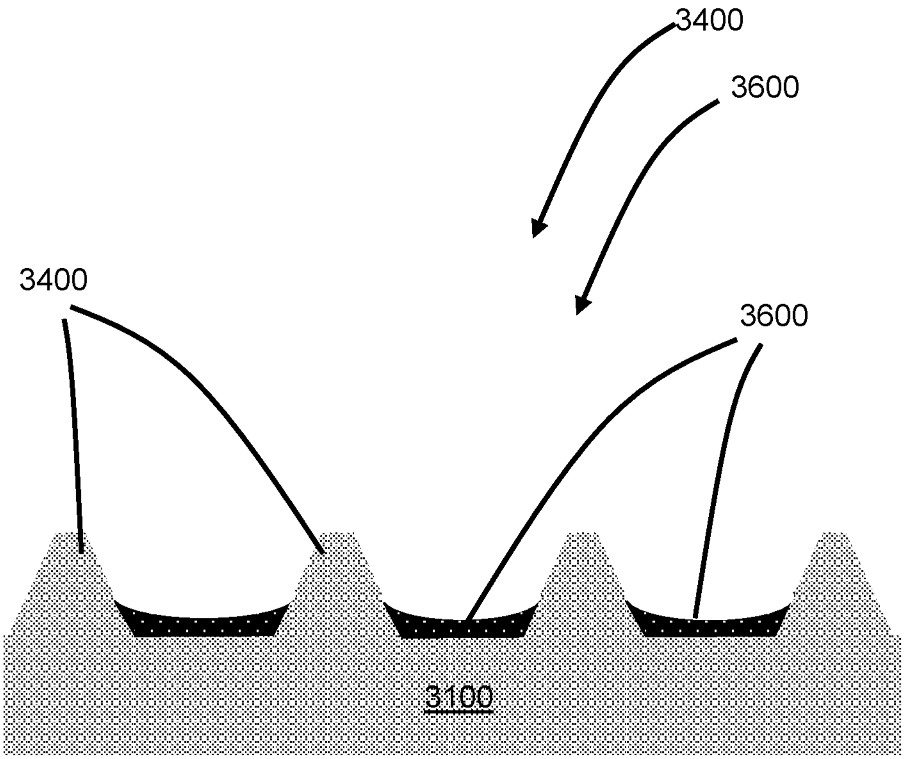
FIG. 35 is an illustration of a mask layer formed between the plurality of pillars in accordance with an example embodiment.

FIG. 35 is an illustration of a mask layer 3600 formed between plurality of pillars 3400 in accordance with an example embodiment. Mask layer 3600 is used in the epitaxial growth processes overlying silicon carbide substrate 3100 as will be subsequently described herein below. In one embodiment, mask layer 3600 is formed by reducing the thickness of refill layer 3500 from FIG. 34 using an etching process. In one embodiment, refill layer 3500 of FIG. 34 is a carbon layer and is etched using RIE (Reactive Ion Etching) to form mask layer 3600. In one embodiment, a height of refill layer 3500 is reduced to a predetermined height to form mask layer 3600. In general, mask layer 3600 has a height or thickness less than a height of plurality of pillars 3400. The predetermined height is achieved by RIE using oxygen, argon and other gases, as well known to those skilled in the art. In one embodiment, the predetermined height of mask layer 3600 is in a range of (300-1000) nanometers.

Figure 36:
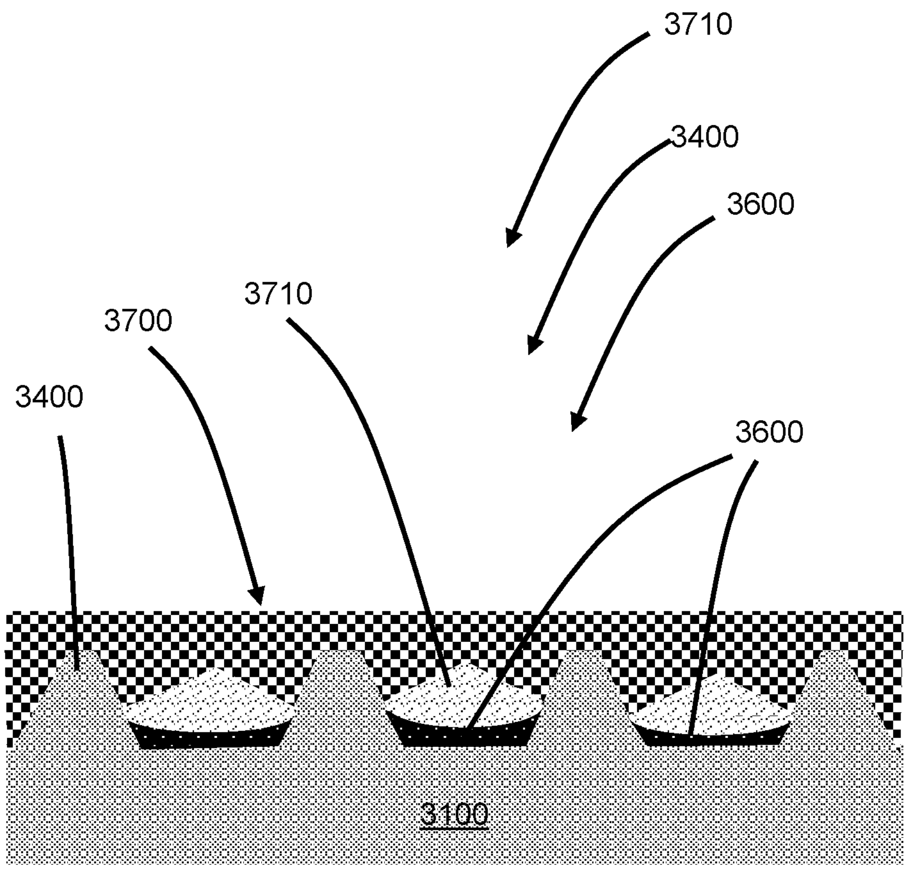
FIG. 36 is an illustration of the method for growing one or more low defect silicon carbide epitaxial layers in accordance with an example embodiment.

FIG. 36 is an illustration of the method for growing one or more low defect silicon carbide epitaxial layers in accordance with the example embodiment. In this method, silicon carbide substrate 3100 comprises a plurality of pillars 3400 shaped as truncated pyramids and mask layer 3600 is between plurality of pillars 3400. In one embodiment, mask layer 3600 comprises carbon. Silicon carbide substrate 3100 is placed in an epitaxial reactor. As explained in detail earlier, the epitaxial growth process is initiated by step flow growth of the 4H—SiC polytype on the surfaces of plurality of pillars 3400. Since the area of the tops of the truncated pyramids comprising plurality of pillars 3400 is very small as compared to the base area of the truncated pyramids, the process of step flow growth is quickly terminated and is followed by the lateral growth of the 4H—SiC polytype on the sidewalls of the truncated pyramids in the <1120>, or <1100> direction. In addition to the lateral 4H—SiC growth on the sidewalls of the truncated pyramids comprising plurality of pillars 3400, there is vertical growth of polycrystalline 3C-SiC layer 3710 overlying mask layer 3600 comprising carbon. Note that the lateral 4H—SiC growth from the sidewalls of plurality of pillars 3400 occurs above 3C—SiC layer 3710. By modulation of the growth parameters of temperature, gas precursors, and pressure, a high quality epitaxial layer is grown laterally with very low defect density. As the epitaxial layer growth process continues, the gap between plurality of pillars 3400 is reduced by the formation of a high quality (low defect density) lateral epitaxial layer growing from the sidewalls of plurality of pillars 3400. At a certain stage of the epitaxial growth process, the lateral 4H—SiC epitaxial regions of adjacent pillars of plurality of pillars 3400 merge and results in a continuous epitaxial layer with the formation of a merged epitaxial lateral overgrowth (MELO) layer 3700 overlying regions of 3C-SiC layer 3710 growing over mask layer 3600. Since merged epitaxial lateral overgrowth (MELO) layer 3700 of 4H—SiC polytype is laterally grown, it has very low defectivity and is a high quality silicon carbide epitaxial layer.

Figure 37:
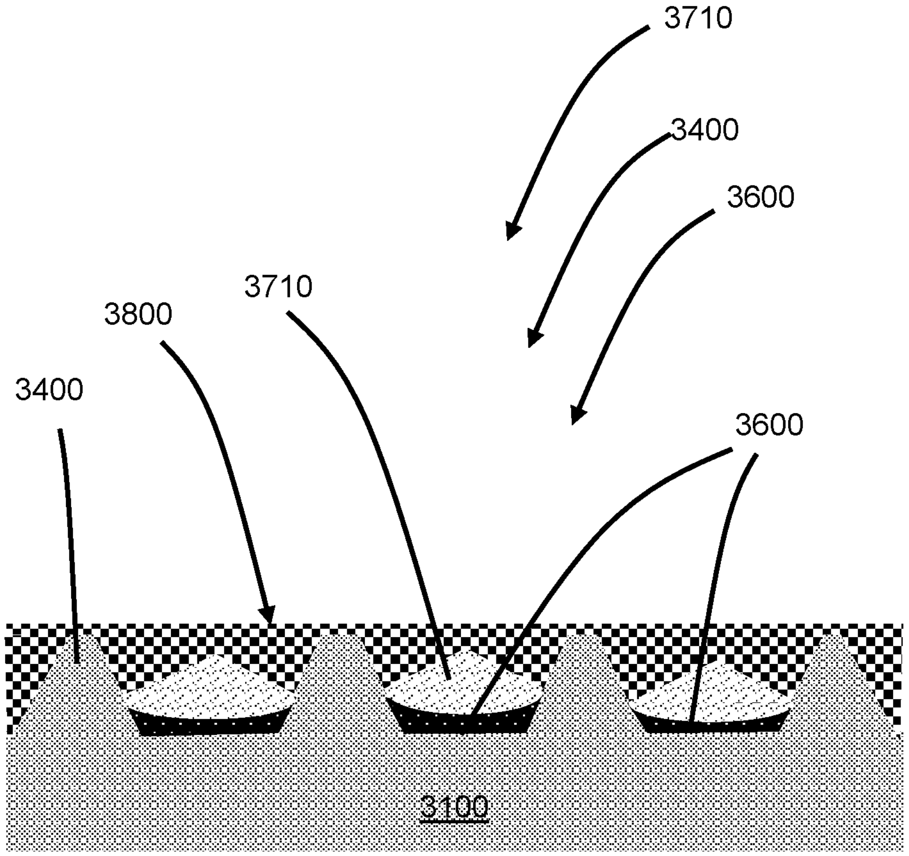
FIG. 37 is an illustration of a Silicon Carbide epitaxial layer in accordance with an example embodiment.

FIG. 37 is an illustration of a Silicon Carbide epitaxial layer 3800 in accordance with an example embodiment. The surface of merged epitaxial lateral overgrowth (MELO) layer 3700 comprises the epitaxial lateral overgrowth with step flow growth regions over the tops of truncated pyramids of plurality of pillars 3400 contributing to a surface roughness. A surface of MELO layer 3700 is lightly polished and includes restoring the orientation of the original off-cut axis of silicon carbide substrate 3100. The light polishing step is called a kiss polish and removes any surface defects on the surface of merged epitaxial lateral overgrowth (MELO) layer 3700 resulting in silicon carbide epitaxial layer 3800 with a 4 degree off cut surface for subsequent epitaxial steps while including very low density of defects. In one embodiment, the surface of MELO layer 3700 comprises lateral 4H—SiC growth and a top surface of plurality of pillars 3400 after the kiss polish.

Figure 38:
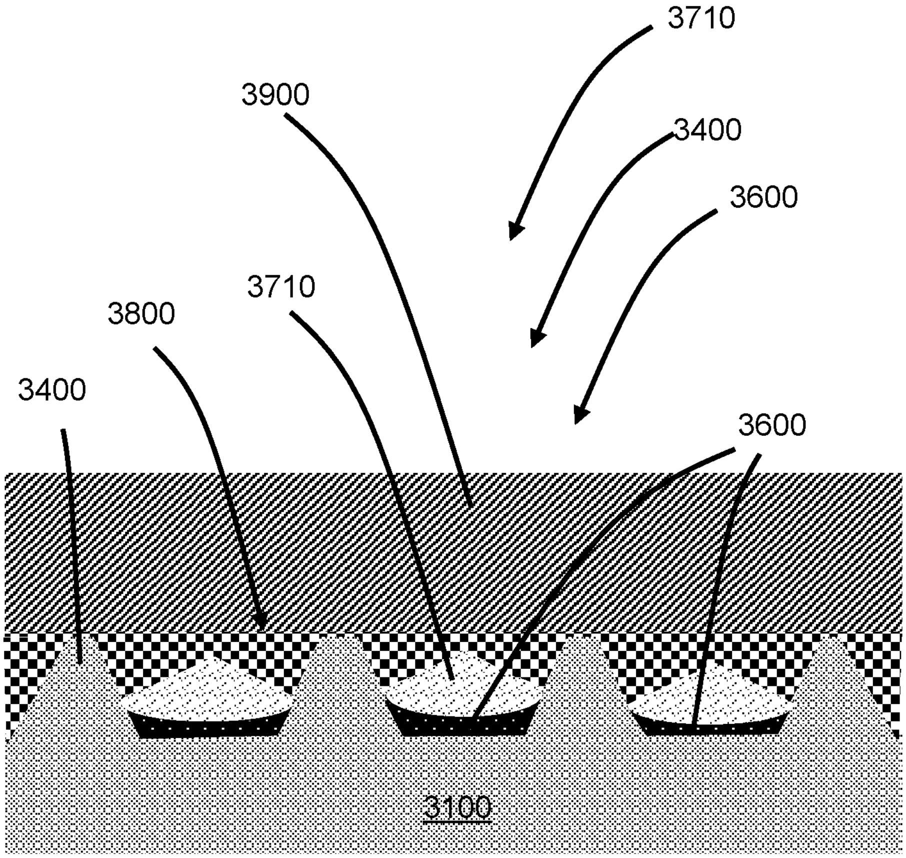
FIG. 38 is an illustration of a silicon carbide epitaxial layer formed overlying the first silicon carbide epitaxial layer in accordance with an example embodiment.

FIG. 38 is an illustration of a silicon carbide epitaxial layer 3900 formed overlying silicon carbide epitaxial layer 3800 in accordance with an example embodiment. In one embodiment, a device is formed in silicon carbide epitaxial layer 3900 that is grown overlying silicon carbide epitaxial layer 3800 in an epitaxial reactor. In one embodiment, silicon carbide epitaxial layer 3900 is grown by standard epitaxial process configured for vertical growth having the same crystal orientation as MELO layer 3700. Silicon carbide epitaxial layer 3900 may be termed as a device epitaxial layer since a silicon carbide device is formed in this layer as described in subsequent processing steps. Silicon carbide epitaxial layer 3900 may comprise one or more silicon carbide epitaxial layers which may have different thickness and doping concentrations and types. In one embodiment, a buffer epitaxial layer comprising heavily doped silicon carbide is grown over silicon carbide epitaxial layer 3800 and followed by a lighter doped silicon carbide epitaxial layer on which a semiconductor device is formed. Since silicon carbide epitaxial layer 3900 is grown overlying silicon carbide epitaxial layer 3800 of high quality, silicon carbide epitaxial layer 3900 is also of very high quality implying very low defect density. In one embodiment, defect propagation is reduced by maximizing the area of lateral 4H—SiC to the area of the top surface of plurality of pillars 3400 exposed on the surface of MELO layer 3700 prior to growing silicon carbide epitaxial layer 3900. Thus, semiconductor devices with high performance and high reliability can be formed by using this method of forming silicon carbide epitaxial layers with low defect density.

Figure 39:
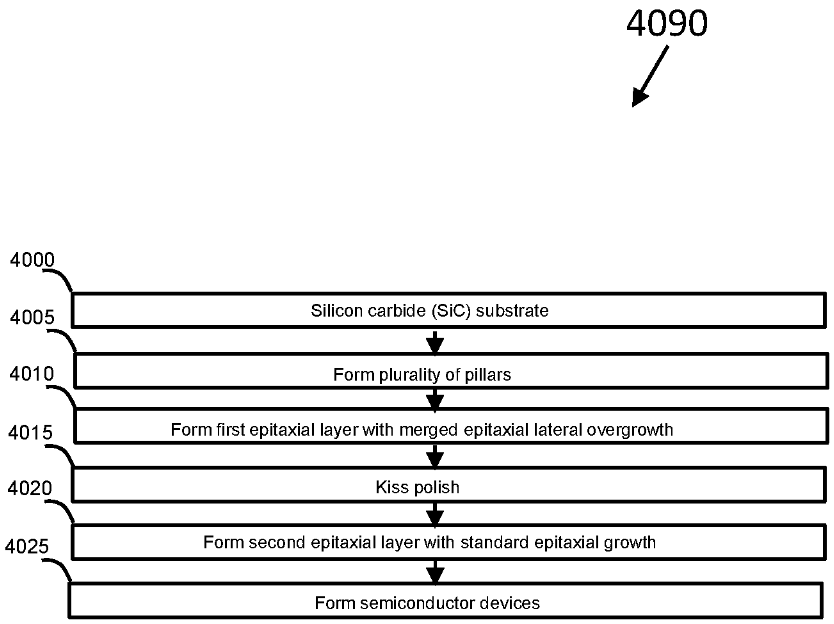
FIG. 39 is an illustration of a block diagram for forming semiconductor devices using a patterned silicon carbide substrate in accordance with an example embodiment.

FIG. 39 is an illustration of a block diagram 4090 for forming semiconductor devices using a patterned silicon carbide substrate in accordance with an example embodiment.

In FIG. 39, block 4000 shows a silicon carbide substrate used for formation of semiconductor devices in accordance with an example embodiment. The silicon carbide substrate shown in block is off-cut to 4 degrees to the [0001] direction to facilitate high quality homo-epitaxial growth. Block 4005 shows the formation of a plurality of pillars in the silicon carbide substrate. The plurality of pillars in block 4005 enables the formation of a patterned silicon carbide substrate. The plurality of pillars in block 4005 may be (0.25-4) microns in height and adjacent pillars may be spaced (0.25-4) microns apart. The size each pillar of plurality of pillars of block 4005 may be in the range of (0.25-4) microns. The shape of each pillar in plurality of pillars of block 4005 may be square, rectangular, round, hexagon, triangular, diamond and other shapes that facilitate lateral epitaxial overgrowth. Block 4010 shows the formation of a first epitaxial layer with merged epitaxial lateral overgrowth with low defect density. In block 4010, the plurality of pillars enables the growth of high quality silicon carbide laterally in the <1120> or <1000> directions resulting in a first epitaxial layer of high quality of silicon carbide with merged epitaxial lateral overgrowth.

The process for growing high quality epitaxial layers attached to the silicon carbide substrate of block 4000 will comprise a step of growing epitaxy by lateral epitaxial overgrowth on the silicon carbide substrate with plurality of pillars of block 4005. In one embodiment, 4H—SiC growth will occur along the <1120> or <1100> directions due to the lateral epitaxial growth. In one embodiment, the lateral epitaxial overgrowth comprises growth from sidewalls of each pillar of the plurality of pillars of block 4005. In one embodiment, lateral epitaxial overgrowth from the sidewalls from each pillar of the plurality of pillars of block 4005 will merge comprising merged epitaxial lateral overgrowth (MELO) that is high quality low defectivity epitaxy. In one embodiment, the merged epitaxial lateral overgrowth (MELO) from the lateral epitaxial overgrowth process will form a continuous epitaxial layer overlying a vertical 4H—SiC growth in the spacing between plurality of pillars due to step flow growth. This merged epitaxial lateral growth is possible by controlling the height of plurality of pillars and spacings between adjacent pillars in plurality of pillars to form a high quality SiC epitaxial layer with low defect density.

In the example embodiment, the quality of the first epitaxial layer is improved by increasing a ratio of the surface of the merged epitaxial lateral overgrowth (MELO) epitaxy to a combined area of the top surface of each pillar of plurality of pillars thereby decreasing defect propagation in the formation of subsequent epitaxial layers. In one embodiment, subsequent epitaxial layers are formed using standard epitaxy processes that are configured for vertical epitaxial growth. In one embodiment, the silicon carbide substrate of block 4000, the first epitaxial layer of block 4010, and subsequent epitaxial layers are all single crystal identical to silicon carbide substrate of block 4000.

Block 4015 shows the step of performing a kiss polish of the surface of the first epitaxial layer of block 4010 so as to expose a top surface of each pillar of the plurality of pillars and the merged epitaxial lateral overgrowth of block 4010. The kiss polish of block 4015 is in the same orientation of the 4 degrees off-cut the [0001] direction of the silicon carbide substrate of block 4000.

Block 4020 shows the process of forming a second epitaxial layer of silicon carbide overlying the first epitaxial layer after the kiss polish. The second epitaxial layer of silicon carbide grows with standard epitaxial growth but with a high quality (low defect density) due to the first epitaxial layer with merged epitaxial lateral overgrowth with a kiss polish. Block 4025 shows the formation of semiconductor devices on or in the second epitaxial layer of high quality (low defect density) overlying the first epitaxial layer with merged epitaxial lateral overgrowth.

While the present invention has been described with reference to certain preferred embodiments or methods, it is to be understood that the present invention is not limited to such specific embodiments or methods. Rather, it is the inventor's contention that the invention be understood and construed in its broadest meaning as reflected by the following claims. Thus, these claims are to be understood as incorporating not only the preferred methods described herein but all those other and further alterations and modifications as would be apparent to those of ordinary skilled in the art.

The descriptions disclosed herein below will call out components, materials, inputs, or outputs from FIGS. 1-38.

In one embodiment, a method for growing one or more low defect Silicon Carbide (SiC) epitaxial layers comprises providing a SiC substrate 500 wherein an surface of SiC substrate 500 is off-axis, forming a plurality of pillars 900 in SiC substrate 500 wherein each pillar of plurality of pillars 900 has a top surface area, forming a mask layer 1100 between plurality of pillars 900 in SiC substrate 500, growing a first SiC epitaxial layer 1500 wherein first SiC epitaxial layer 1500 comprises plurality of pillars 900 and epitaxy grown using epitaxial lateral overgrowth 1400 and wherein defect propagation from SiC substrate 500 is reduced in subsequently grown epitaxial layers by increasing a surface area of the epitaxy grown by epitaxial lateral overgrowth 1400 in relation to the top surface area of plurality of pillars 900.

In one embodiment, the method comprises performing a kiss polish on SiC epitaxial layer 1500 surface wherein the kiss polish is performed off-axis substantially equal to the off-axis surface of SiC substrate 500 and growing a second SiC epitaxial layer 1900 overlying the SiC epitaxial layer 1500.

In one embodiment, the method further includes a step of performing a kiss polish in a range of 2 to 8 degrees off-axis.

In one embodiment, the method comprises plurality of pillars 900 configured to be oriented in the <1120> or <1100> directions.

In one embodiment, the method wherein the predetermined surface area of each pillar is configured to be in a range of 0.25 microns to 4.0 microns.

In one embodiment, the method wherein the spacing 920 between each pillar of plurality of pillars 900 is configured to be in a range of 0.25 microns to 4.0 microns.

In one embodiment, the height 910 of each pillar of plurality of pillars 900 is configured to be in a range of 0.25 microns to 4.0 microns.

In one embodiment, the on-axis surface faceting of first SiC epitaxial layer 1500 surface is configured to be oriented in the <0001> direction.

In one embodiment, mask layer 1100 comprises carbon wherein mask layer 1100 has a height less than height 910 of plurality of pillars 900 and wherein mask layer 1100 is configured to support exfoliation of first SiC epitaxial layer 1500 from SiC substrate 500.

In one embodiment, the method wherein SiC substrate 500 is 4H (Hexagonal) SiC and wherein a surface of first SiC epitaxial layer 1500 comprises the top surface area of each pillar of plurality of pillars 900 until a step flow growth has stopped and further comprising the 4H (Hexagonal) SiC epitaxial lateral overgrowth 1400 of first SiC epitaxial layer 1500 coupling to sidewalls of plurality of pillars 900.

In one embodiment, the method wherein a 3C (Cubic) SiC layer 1410 underlies the 4H (Hexagonal) SiC epitaxial overgrowth coupling to the sidewalls of plurality of pillars 900 and overlies mask layer 1100.

In one embodiment, the method wherein one or more devices are formed on or in second SiC epitaxial layer 1900.

In one embodiment, wherein the method includes the steps of coupling a handle wafer 2400 to a surface of second SiC epitaxial layer 1900, heating mask layer 1100 selectively with a laser wherein heat from mask layer 1100 is configured to vaporize or break by thermal shock at least a portion of plurality of pillars 900 adjacent to mask layer 1100; mechanically separating the first and second epitaxial layers from SiC substrate 500, depositing a back metal layer 2700 on an exposed surface of first SiC epitaxial layer 1500, removing handle wafer 2400 from the first and second SiC epitaxial layers and dicing the first and second SiC epitaxial layers into individual die.

In one embodiment, the method further includes preparing a surface of SiC substrate 2500 after separation from the first and second SiC epitaxial layers to form a second SiC substrate 2800 configured for reuse and reusing second SiC substrate 2800 to form one or more devices.

In one embodiment, the method wherein the top surface of each pillar of plurality of pillars 900 are circular, triangular, square, rectangular, hexagonal, or a truncated pyramid.

In one embodiment, a method for growing one or more low defect Silicon Carbide (SiC) epitaxial layers comprises the steps of etching a surface of SiC substrate 500 to form plurality of pillars 900, forming mask layer 1100 between plurality of pillars 900 in SiC substrate 500 wherein mask layer 1100 is less than height 910 of plurality of pillars 900, growing by lateral epitaxial overgrowth first SiC epitaxial layer 1500 homogeneous to SiC substrate 500 wherein a surface of first SiC epitaxial layer 1500 comprises a step flow growth on a top surface area of each pillar of plurality of pillars 900 and lateral epitaxial overgrowth between each pillar of plurality of pillars 900 and growing second SiC epitaxial layer 1900 homogenous to SiC substrate 500 wherein defect propagation in second SiC epitaxial layer 1900 is reduced by decreasing a top surface area of each pillar of plurality of pillars 900.

In one embodiment, the methods further includes growing first SiC epitaxial layer 1500 by lateral epitaxial overgrowth such that the surface of first SiC epitaxial layer 1500 has on-axis surface faceting wherein mask layer 1100 supports the lateral epitaxial overgrowth and performing a kiss polish off-axis using chemical mechanical planarization to expose the surface of first SiC epitaxial layer 1500 comprising the top surface of each pillar of plurality of pillars 900 and the surface of the epitaxy grown by lateral epitaxial overgrowth wherein the kiss polish off-axis is substantially equivalent to an off-axis surface of SiC substrate 500.

In one embodiment, the method wherein plurality of pillars 900 are configured to be oriented in the <1120>, <1100> directions and wherein the on-axis faceting is in the <0001> direction.

In one embodiment, the method wherein plurality of pillars 900 are shaped as truncated pyramids.

In one embodiment, the method wherein the surface of each pillar is circular or a polygon.

In one embodiment, the method wherein each pillar of plurality of pillars 900 are configured to be in a range of 0.25 microns to 4 microns in diameter or maximum dimension.

In one embodiment, the method wherein spacing 920 between each pillar of plurality of pillars 900 is configured to be in a range of 0.25 microns to 4.0 microns.

In one embodiment, the method wherein height 910 of each pillar of plurality of pillars 900 is configured to be in a range of 0.25 microns to 4.0 microns.

In one embodiment, the method wherein the step of growing second SiC epitaxial layer 1900 comprises a step of growing second SiC epitaxial layer 1900 by a standard epitaxial process.

In one embodiment, the method wherein the step of forming mask layer 1100 further includes a step of forming a layer of carbon between plurality of pillars 900 wherein the carbon supports lateral overgrowth and wherein the carbon is configured to support exfoliation of the first and second SiC epitaxial layers from SiC substrate 500.

In one embodiment, the method further includes a step of forming a plurality of devices in or on second SiC epitaxial layer 1900.

In one embodiment, the method wherein the step of growing second SiC epitaxial layer 1900 comprises a step of forming first SiC epitaxial layer 1500 having a higher doping concentration than second SiC epitaxial layer 1900.

In one embodiment, the method further includes the steps of heating the carbon layer wherein the heating of the carbon layer vaporizes or breaks by thermal shock at last a portion of plurality of pillars 900 adjacent to the carbon layer, mechanically separating the first and second SiC epitaxial layers from SiC substrate 500, dicing the plurality of devices formed in the first or second SiC epitaxial layers; and packaging the plurality of devices.

In one embodiment, the method further includes preparing a surface of the SiC substrate to form a second SiC substrate, etching a surface of second SiC substrate to form a plurality of pillars, growing by lateral epitaxial overgrowth a first SiC epitaxial layer homogeneous to the second SiC substrate wherein a surface of the first SiC epitaxial layer of the second SiC substrate comprises a top surface area of each pillar of the plurality of pillars of the second SiC substrate and a surface area of epitaxy grown by the lateral epitaxial overgrowth overlying the second SiC substrate, growing a second epitaxial layer homogenous to the second SiC substrate wherein defect propagation in the second SiC epitaxial layer of second SiC substrate 2500 is reduced by decreasing the top surface area of each pillar of the plurality of pillars of the second SiC substrate.

In one embodiment, silicon carbide substrate 500 having one or more low defect SiC epitaxial layers comprises silicon carbide substrate 500, plurality of pillars 900 formed in SiC substrate 500, mask layer 1100 formed between plurality of pillars 900, layer of 3C (Cubic) SiC overlying mask layer 1100 and a SiC layer of epitaxy grown by epitaxial lateral overgrowth overlying the layer of 3C SiC.

In one embodiment, Silicon Carbide (SiC) substrate 500 having one or more low defect SiC epitaxial layers wherein the layer of epitaxy grown by epitaxial lateral overgrowth is 4H (Hexagonal) SiC.

In one embodiment, Silicon Carbide (SiC) substrate 500 having one or more low defect SiC epitaxial layers wherein a combined height of mask layer 1100 and the layer of 3C SiC is less than a height of plurality of pillars 900.

In one embodiment, Silicon Carbide (SiC) substrate 500 having one or more low defect SiC epitaxial layers wherein first SiC epitaxial layer 1500 comprises plurality of pillars 900 and the SiC layer grown by the epitaxial lateral overgrowth wherein a surface of first SiC epitaxial layer 1500 comprises a top surface of plurality of pillars 900 and a surface of the epitaxy formed by lateral overgrowth.

In one embodiment, Silicon Carbide (SiC) substrate 500 having one or more low defect SiC epitaxial layers further includes second SiC epitaxial layer 1900 configured to be grown overlying the surface of first SiC epitaxial layer 1500 wherein defect propagation is lowered in second SiC epitaxial layer 1900 by increasing a ratio of a surface area of the SiC layer grown by lateral overgrowth to an area of the top surface of plurality of pillars 900.

In one embodiment, Silicon Carbide (SiC) substrate 500 having one or more low defect SiC epitaxial layers wherein a surface of SiC substrate 500 is off-axis.

In one embodiment, Silicon Carbide (SiC) substrate 500 having one or more low defect SiC epitaxial layers wherein first SiC epitaxial layer 1500 has a surface polished off-axis substantially equivalent to SiC substrate 500 off-axis.

In one embodiment, Silicon Carbide (SiC) substrate 500 having one or more low defect SiC epitaxial layers wherein first SiC epitaxial layer 1500 is planarized at 2 to 8 degrees off-axis.

In one embodiment, Silicon Carbide (SiC) substrate 500 having one or more low defect SiC epitaxial layers wherein SiC substrate 500 is 4H (Hexagonal) SiC, wherein the epitaxial lateral overgrowth of first SiC epitaxial layer 1500 comprises the top surface area of each pillar of plurality of pillars 900 until a step flow growth has stopped and further comprising the epitaxial lateral overgrowth of the first SiC layer extending from sidewalls of plurality of pillars 900 and overlying 3C SiC layer 1410.

In one embodiment, Silicon Carbide (SiC) substrate 500 having one or more low defect SiC epitaxial layers wherein SiC substrate 500 and first SiC epitaxial layer 1500 are homogenous single crystal.

In one embodiment, Silicon Carbide (SiC) substrate 500 having one or more low defect SiC epitaxial layers wherein plurality of pillars 900 are oriented in the <1120>, <1100> directions and wherein the size of the pillars are in a range of 0.5 microns to 2.0 microns.

In one embodiment, Silicon Carbide (SiC) substrate 500 having one or more low defect SiC epitaxial layers wherein spacing 920 between pillars is in a range of 0.5 microns to 2.0 microns.

In one embodiment, Silicon Carbide (SiC) substrate 500 having one or more low defect SiC epitaxial layers wherein height 910 of each pillar of plurality of pillars 900 is in a range of 0.5 microns to 2.0 microns.

In one embodiment, Silicon Carbide (SiC) substrate 500 having one or more low defect SiC epitaxial layers wherein mask layer 1100 comprises carbon and has a thickness in a range of 0.25 microns to 0.75 microns and wherein mask layer 1100 supports exfoliation of first SiC epitaxial layer 1500 and second SiC epitaxial layer 1900 from SiC substrate 500.

In one embodiment, Silicon Carbide (SiC) substrate 500 having one or more low defect SiC epitaxial layers wherein each pillar of plurality of pillars 900 has a taper such as a truncated pyramid shape to reduce a top surface area of each pillar of plurality of pillars 900.

In one embodiment, Silicon Carbide (SiC) substrate 500 having one or more low defect SiC epitaxial layers wherein second SiC epitaxial layer 1900 is configured to be grown by standard epitaxy that supports vertical and lateral epitaxial growth.

In one embodiment, Silicon Carbide (SiC) substrate 500 having one or more low defect SiC epitaxial layers wherein first SiC epitaxial layer 1500 has a higher doping concentration than second SiC epitaxial layer 1900.

In one embodiment, Silicon Carbide (SiC) substrate 500 having one or more low defect SiC epitaxial layers wherein the one or more SiC devices are formed on or in second SiC epitaxial layer 1900.

In one embodiment, Silicon Carbide (SiC) substrate 500 having one or more low defect SiC epitaxial layers wherein the one or more SiC devices are a MOSFET or a Schottky barrier diode.

In one embodiment, Silicon Carbide (SiC) substrate 500 having one or more low defect SiC epitaxial layers further includes a handle wafer 2400 configured to couple to second SiC substrate 1900.

In one embodiment, Silicon Carbide (SiC) substrate 500 having one or more low defect SiC epitaxial layers wherein mask layer 1100 comprises carbon.

In one embodiment, Silicon Carbide (SiC) substrate 500 having one or more low defect SiC epitaxial layers wherein mask layer 1100 comprises Tantulum Carbide.

In one embodiment, Silicon Carbide (SiC) substrate 500 having one or more low defect SiC epitaxial layers wherein mask layer 1100 is configured to be selectively heated by laser and wherein at least a portion of each pillar of plurality of pillars 900 is configured to be vaporized or broken by thermal shock by the heat.

In one embodiment, Silicon Carbide (SiC) substrate 500 having one or more low defect SiC epitaxial layers wherein the first and second SiC epitaxial layers are configured to be mechanically separated from SiC substrate 500.

In one embodiment, Silicon Carbide (SiC) substrate 500 having one or more low defect SiC epitaxial layers further includes back metal layer 2700 on a surface of first SiC epitaxial layer 1500.

In one embodiment, Silicon Carbide (SiC) substrate 500 having one or more low defect SiC epitaxial layers wherein one or more SiC devices are configured to be diced and packaged.

What is claimed:

1. A silicon carbide (SiC) substrate having one or more SiC epitaxial layers comprising:

a SiC substrate;

a plurality of pillars formed in the SiC substrate;

a layer comprising carbon formed in openings adjacent to each pillar of the plurality of pillars;

a SiC layer of epitaxy grown by epitaxial lateral overgrowth forming a surface overlying the SiC substrate that is single crystal to the SiC substrate; and a layer of polycrystalline 3C (Cubic) SiC overlying the layer of carbon and underlying the SiC layer.

2. The silicon carbide (SiC) substrate having one or more SiC epitaxial layers of claim 1, wherein the SiC layer of epitaxy grown by epitaxial lateral overgrowth between adjacent pillars of the plurality of pillars overlies the layer of polycrystalline 3C (Cubic) SiC and wherein the SiC layer is 4H (Hexagonal) SiC.

3. The silicon carbide (SiC) substrate having one or more SiC epitaxial layers of claim 2, wherein a combined height of the layer comprising carbon and the layer of polycrystalline 3C SiC is less than a height of the plurality of pillars.

4. The silicon carbide (SiC) substrate having one or more SiC epitaxial layers of claim 1, wherein the SiC layer is polished, wherein a first SiC epitaxial layer comprises the plurality of pillars and the SiC layer grown by the epitaxial lateral overgrowth, and wherein a surface of the first SiC epitaxial layer comprises a top surface of the plurality of pillars and a surface of the epitaxy formed by lateral overgrowth.

5. The silicon carbide (SiC) substrate having one or more SiC epitaxial layers of claim 4 further including a second SiC epitaxial layer configured to be grown overlying the surface of the first SiC epitaxial layer.

6. The silicon carbide (SiC) substrate having one or more SiC epitaxial layers of claim 5, wherein a surface of the SiC substrate is off-axis.

7. The silicon carbide (SiC) substrate having one or more SiC epitaxial layers of claim 6, wherein the first SiC epitaxial layer has a surface polished to remove step flow growth regions.

8. The silicon carbide (SiC) substrate having one or more SiC epitaxial layers of claim 7, wherein the first SiC epitaxial layer is planarized in a range of 2 to 8 degrees off-axis.

9. The silicon carbide (SiC) substrate having one or more SiC epitaxial layers of claim 2, wherein the SiC substrate is 4H (Hexagonal) SiC, wherein lateral fronts of SiC layer grown by epitaxial lateral overgrowth extend from sidewalls of each pillar of the plurality of pillars and are single crystal to the SiC substrate, wherein the lateral fronts from adjacent pillars of the plurality of pillars merge, and wherein the SiC layer grown by epitaxial lateral overgrowth not coupled to the plurality of pillars in the openings adjacent to the plurality of pillars forms the layer of 3C (Cubic) SiC.

10. The silicon carbide (SiC) substrate having one or more SiC epitaxial layers of claim 4, wherein the SiC substrate and the first SiC epitaxial layer are homogenous single crystal.

11. The silicon carbide (SiC) substrate having one or more SiC epitaxial layers of claim 1, wherein the plurality of pillars are oriented in one of a <1120> direction or a <1100> direction.

12. The silicon carbide (SiC) substrate having one or more SiC epitaxial layers of claim 1, wherein spacing between pillars is in a range of 0.5 microns to 2.0 microns.

13. The silicon carbide (SiC) substrate having one or more SiC epitaxial layers of claim 1, wherein a height of each pillar of the plurality of pillars is in a range of 0.5 microns to 2.0 microns.

14. The silicon carbide (SiC) substrate having one or more SiC epitaxial layers of claim 1, wherein the layer comprising carbon has a thickness in a range of 0.25 microns to 0.75 microns.

15. The silicon carbide (SiC) substrate having one or more SiC epitaxial layers of claim 1 wherein a top surface of each pillar of the plurality of pillars has one of a round, a square, a rectangular, a hexagonal, a triangular, a diamond, or a point of a truncated pyramid shape.

16. The silicon carbide (SiC) substrate having one or more SiC epitaxial layers of claim 5, wherein the second SiC epitaxial layer is configured to be grown by standard epitaxy that supports vertical and lateral epitaxial growth.

17. The silicon carbide (SiC) substrate having one or more SiC epitaxial layers of claim 16, wherein the first SiC epitaxial layer has a higher doping concentration than the second SiC epitaxial layer.

18. The silicon carbide (SiC) substrate having one or more SiC epitaxial layers of claim 16, wherein one or more SiC devices is formed in, on, or overlying the second SiC epitaxial layer.

19. The silicon carbide (SiC) substrate having one or more SiC epitaxial layers of claim 18, wherein the one or more SiC devices are photonic devices, light emitting diodes, radio frequency transistors, MOSFETs, IGBTs (Insulated Gate Bipolar Transistors), or Schottky barrier diodes.

20. The silicon carbide (SiC) substrate having one or more SiC epitaxial layers of claim 18 further including a handle wafer coupled to the SiC substrate.

21. The silicon carbide (SiC) substrate having one or more SiC epitaxial layers of claim 18, wherein the carbon is elemental carbon.

22. The silicon carbide (SiC) substrate having one or more SiC epitaxial layers of claim 18, wherein the carbon is configured to be heated through the SiC substrate.

23. The silicon carbide (SiC) substrate having one or more SiC epitaxial layers of claim 18, wherein the carbon is configured to be selectively heated by laser to weaken or vaporize at least a portion of each pillar of the plurality of pillars.

24. The silicon carbide (SiC) substrate having one or more SiC epitaxial layers of claim 23, wherein the first and second SiC epitaxial layers are configured to be mechanically separated from the SiC substrate.

25. The silicon carbide (SiC) substrate having one or more SiC epitaxial layers of claim 24, wherein the SiC substrate is configured to be reused after separation from the first and second epitaxial layers.

26. The silicon carbide (SiC) substrate having one or more SiC epitaxial layers of claim 1, wherein the SiC layer merges between adjacent pillars of the plurality of pillars.

27. The silicon carbide (SiC) substrate having one or more SiC epitaxial layers of claim 1, wherein the plurality of pillars are formed by etching a plurality of trenches into the SiC substrate.

* * * * *